(12) United States Patent
Shuto et al.

(10) Patent No.: US 11,889,620 B2
(45) Date of Patent: Jan. 30, 2024

(54) RADIO-FREQUENCY MODULE AND COMMUNICATION DEVICE

(71) Applicant: Murata Manufacturing Co., Ltd., Kyoto (JP)

(72) Inventors: Yutaka Shuto, Kyoto (JP); Hiroshi Nishikawa, Kyoto (JP); Tomomi Yasuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1 day.

(21) Appl. No.: 17/662,097

(22) Filed: May 5, 2022

(65) Prior Publication Data
US 2022/0394844 A1 Dec. 8, 2022

(30) Foreign Application Priority Data
Jun. 3, 2021 (JP) ................................. 2021-093817

(51) Int. Cl.
*H05K 1/02* (2006.01)
*H05K 1/11* (2006.01)

(52) U.S. Cl.
CPC ........... *H05K 1/0243* (2013.01); *H05K 1/115* (2013.01); *H05K 2201/1003* (2013.01)

(58) Field of Classification Search
CPC ........ H05K 1/0243; H05K 1/115; H05K 1/18; H05K 1/181; H05K 1/182; H05K 1/183; H05K 1/184; H05K 1/185; H05K 1/189; H05K 2201/1003; H05K 2201/0191; H05K 2201/0715; H05K 2201/09845; H05K 2201/09972; H05K 3/284; H05K 3/4694; H05K 3/4691; H05K 2203/1316; H04B 1/40; H01L 2223/6616; H01L 25/16;
(Continued)

(56) References Cited

U.S. PATENT DOCUMENTS

2004/0066617 A1 4/2004 Hirabayashi et al.
2009/0056978 A1* 3/2009 Miura ................... H05K 1/0271
174/250
(Continued)

FOREIGN PATENT DOCUMENTS

JP H10-50548 A 2/1998
JP 2003-188338 A 7/2003
(Continued)

*Primary Examiner* — Roshn K Varghese
(74) *Attorney, Agent, or Firm* — Pearne & Gordon LLP

(57) ABSTRACT

A radio-frequency module includes a mounting board, a first electronic component, and a second electronic component. The second electronic component is lower in height than the first electronic component. The mounting board includes dielectric layers, conductive layers, and via-conductors. In the mounting board, the dielectric layers and the conductive layers are stacked in the thickness direction of the mounting board. The mounting board has a first region and a second region. The first region overlaps the first electronic component and extends from a first major surface to a second major surface. The second region overlaps the second electronic component and extends from the first major surface to the second major surface. In the mounting board, the conductive layers in the first region are fewer than the conductive layers in the second region. In the mounting board, the first region is thinner than the second region.

20 Claims, 9 Drawing Sheets

(58) Field of Classification Search
CPC ....... H01L 24/16; H01L 23/645; H01L 23/66; H01L 23/49816; H01L 23/13; H01L 23/5383
See application file for complete search history.

(56) References Cited

U.S. PATENT DOCUMENTS

| | | | | |
|---|---|---|---|---|
| 2014/0305686 | A1* | 10/2014 | Kitajima | H05K 1/0298 174/260 |
| 2015/0319844 | A1* | 11/2015 | Kim | H05K 1/028 174/254 |
| 2016/0057862 | A1* | 2/2016 | Kitajima | H05K 1/09 174/251 |
| 2022/0078909 | A1* | 3/2022 | Ogawa | H05K 1/0306 |

FOREIGN PATENT DOCUMENTS

| | | |
|---|---|---|
| JP | 2003-298195 A | 10/2003 |
| WO | 2020/071020 A1 | 4/2020 |

* cited by examiner

RADIO-FREQUENCY MODULE AND COMMUNICATION DEVICE

CROSS REFERENCE TO RELATED APPLICATION

This application claims priority from Japanese Patent Application No. 2021-093817 filed on Jun. 3, 2021. The content of this application is incorporated herein by reference in its entirety.

BACKGROUND OF THE DISCLOSURE

1. Field of the Disclosure

The present disclosure generally relates to radio-frequency modules and communication devices, and more particularly, to a radio-frequency module including a mounting board, and a communication device including the radio-frequency module.

2. Description of the Related Art

International Publication No. 2020/071020 (Patent Document 1) discloses a radio-frequency module including a module substrate (mounting board) having two major surfaces, a circuit element (first electronic component) mounted on one major surface (first major surface) of the two major surfaces of the module substrate, and a filter (second electronic component) mounted on the major surface (first major surface) of the module substrate.

The module substrate has, for example, a layered structure made of a plurality of dielectric layers. The module substrate includes a plurality of conductive films (conductive layers) formed parallel to the two major surfaces of the module substrate, and a plurality of via-conductors.

BRIEF SUMMARY OF THE DISCLOSURE

Regarding the radio-frequency module disclosed in Patent Document 1, it is difficult to reduce its thickness.

A possible benefit of the present disclosure is to provide a radio-frequency module and a communication device that can achieve a low-profile structure.

A radio-frequency module according to an aspect of the present disclosure includes a mounting board, a first electronic component, and a second electronic component. The mounting board has a first major surface and a second major surface opposite to each other. The first electronic component is disposed on the first major surface of the mounting board. The second electronic component is disposed on the first major surface of the mounting board. The second electronic component is lower than the first electronic component. The mounting board includes a plurality of dielectric layers, a plurality of conductive layers, and a plurality of via-conductors. In the mounting board, the plurality of dielectric layers and the plurality of conductive layers are stacked in the thickness direction of the mounting board. The mounting board has a first region and a second region. The first region overlaps the first electronic component when viewed in plan view in the thickness direction of the mounting board and extends from the first major surface to the second major surface. The second region overlaps the second electronic component when viewed in plan view in the thickness direction of the mounting board and extends from the first major surface to the second major surface. In the mounting board, of the plurality of conductive layers, conductive layers in the first region are fewer than conductive layers in the second region. In the mounting board, the first region is thinner than the second region.

A communication device according to an aspect of the present disclosure includes the radio-frequency module described above and a signal processing circuit. The signal processing circuit is coupled to the radio-frequency module.

The radio-frequency module and the communication device according to the aspects of the present disclosure can achieve a low-profile structure of radio-frequency module.

DETAILED DESCRIPTION OF THE DISCLOSURE

Figure 1:
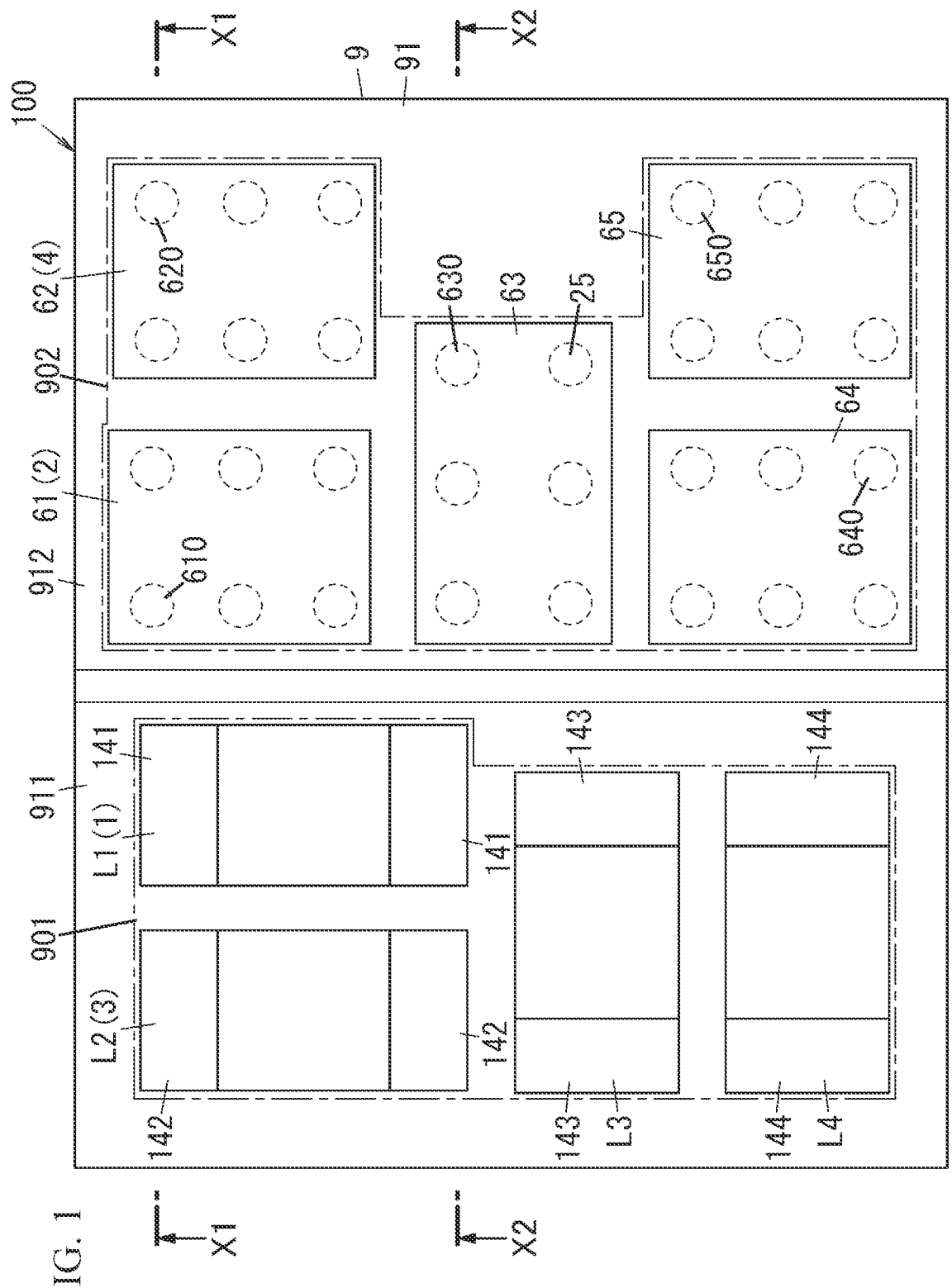
FIG. 1 is a plan view of a radio-frequency module according to a first embodiment.

The drawings referred to in the following first to third embodiments are all schematic drawings, and the proportion of size and thickness of each constituent element in the drawings is not necessarily identical to the corresponding proportion in actual measurements.

First Embodiment

A radio-frequency module 100 according to a first embodiment includes, for example, a mounting board 9, a first electronic component 1, and a second electronic component 2 as illustrated in FIGS. 1 to 6. The mounting board 9 has a first major surface 91 and a second major surface 92 opposite to each other. The first electronic component 1 is disposed on the first major surface 91 of the mounting board 9. The second electronic component 2 is disposed on the first major surface 91 of the mounting board 9. The second electronic component 2 is lower in height than the first electronic component 1. The height of the first electronic component 1 and the height of the second electronic component 2 are determined in a thickness direction D1 of the mounting board 9. The mounting board 9 has a first region 901 and a second region 902. The first region 901 overlaps the first electronic component 1 when viewed in plan view in the thickness direction D1 of the mounting board 9 and extends from the first major surface 91 to the second major surface 92. The second region 902 overlaps the second electronic component 2 when viewed in plan view in the thickness direction D1 of the mounting board 9 and extends from the first major surface 91 to the second major surface 92. In the mounting board 9, a thickness T1 of the first region 901 is less than a thickness T2 of the second region 902.

The radio-frequency module 100 according to the first embodiment further includes a third electronic component 3 and a fourth electronic component 4. The third electronic component 3 is disposed on the first major surface 91 of the mounting board 9. The third electronic component 3 is higher in height than the second electronic component 2. The fourth electronic component 4 is disposed on the first major surface 91 of the mounting board 9. The fourth electronic component 4 is lower in height than both the first electronic component 1 and the third electronic component 3. The first region 901 overlaps the first electronic component 1 and the third electronic component 3 when viewed in plan view in the thickness direction D1 of the mounting board 9. The second region 902 overlaps the second electronic component 2 and the fourth electronic component 4 when viewed in plan view in the thickness direction D1 of the mounting board 9. A height H1 of the first electronic component 1, a height H2 of the second electronic component 2, a height H3 of the third electronic component 3, and a height H4 of the fourth electronic component 4 (refer to FIG. 3) respectively denote the height from the first major surface 91 of the mounting board 9 to the major surface opposite to the mounting board 9 of the first electronic component 1, the second electronic component 2, the third electronic component 3, and the fourth electronic component 4.

Figure 2:
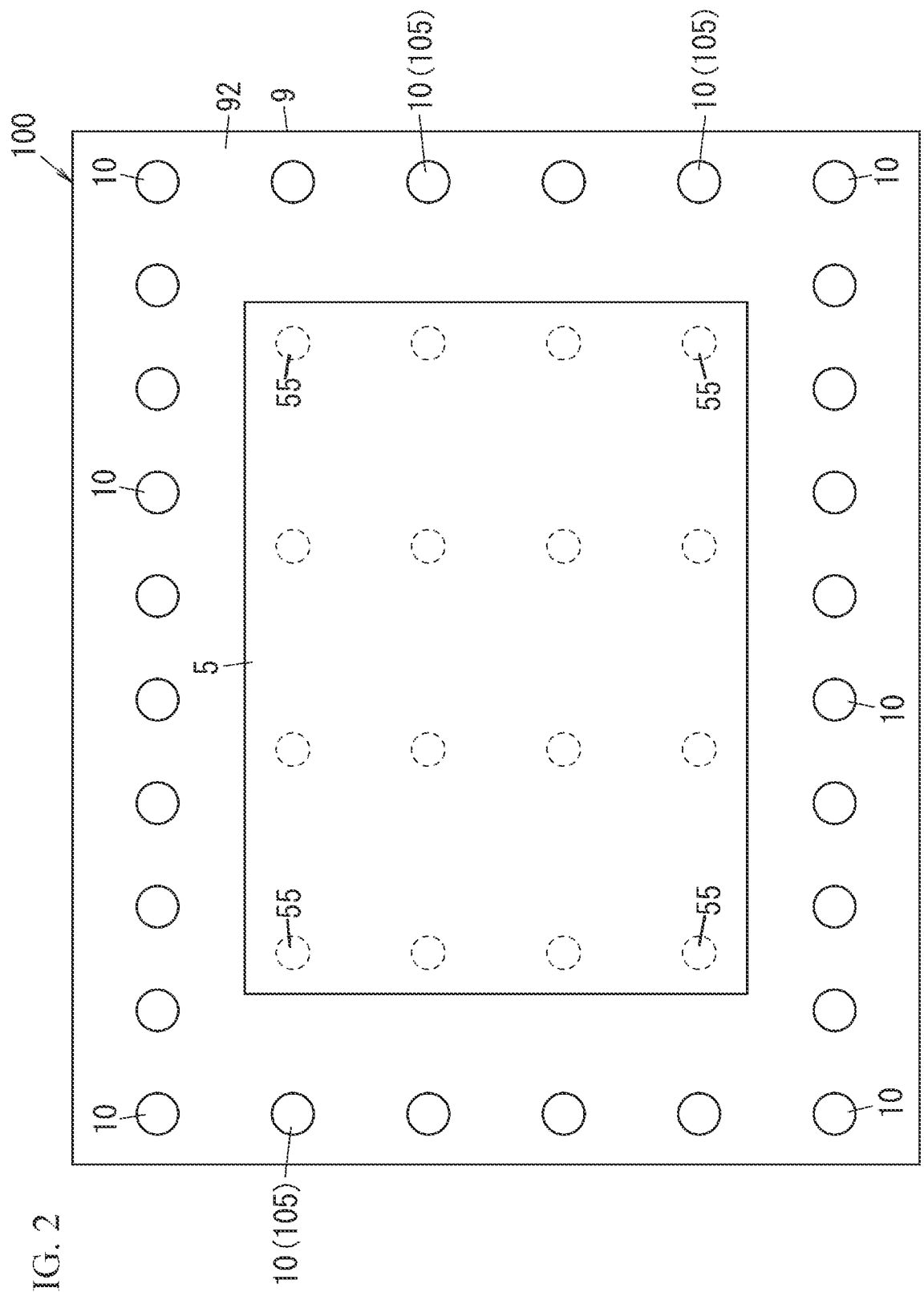
FIG. 2 is a bottom view of the radio-frequency module.
Figure 3:
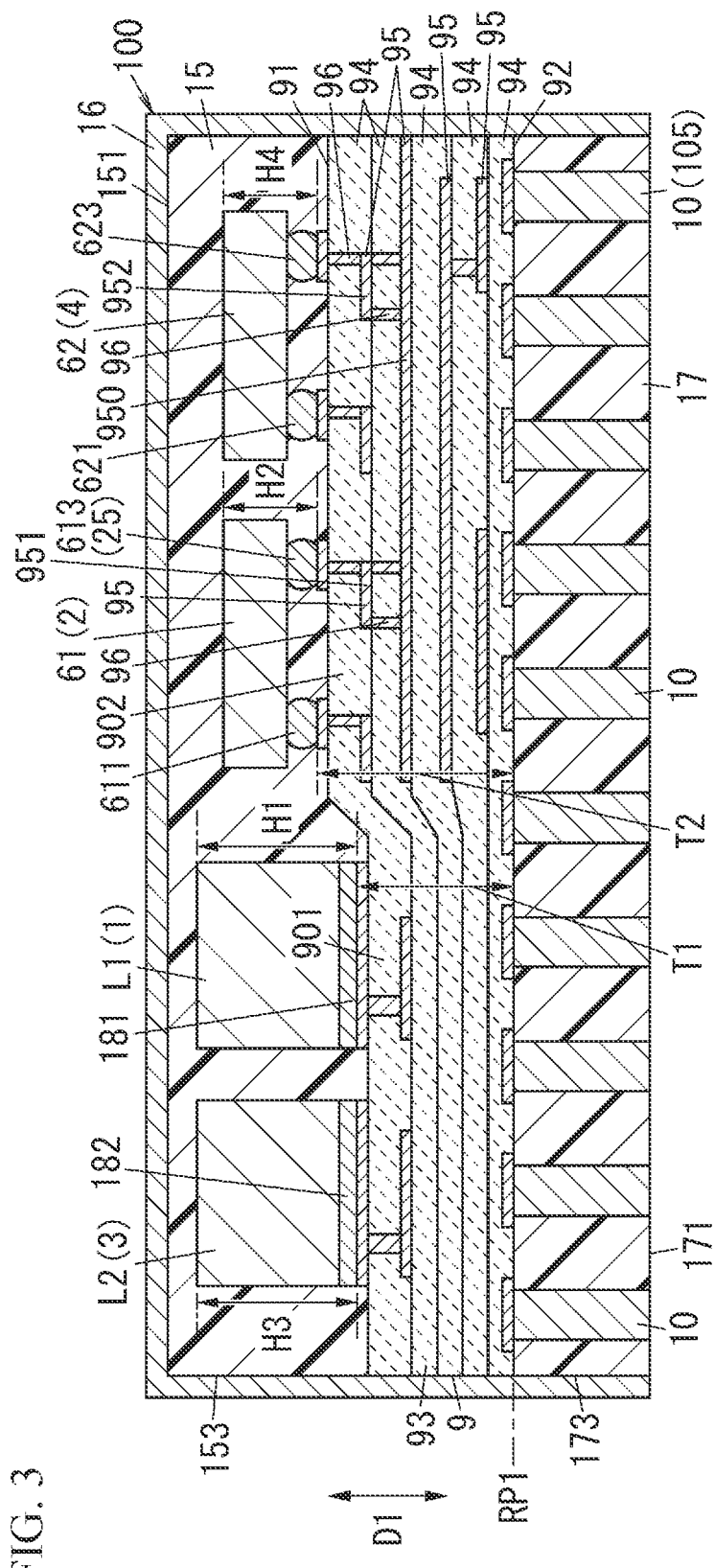
FIG. 3 is a sectional view of the radio-frequency module, taken along line X1-X1 in FIG. 1.
Figure 4:
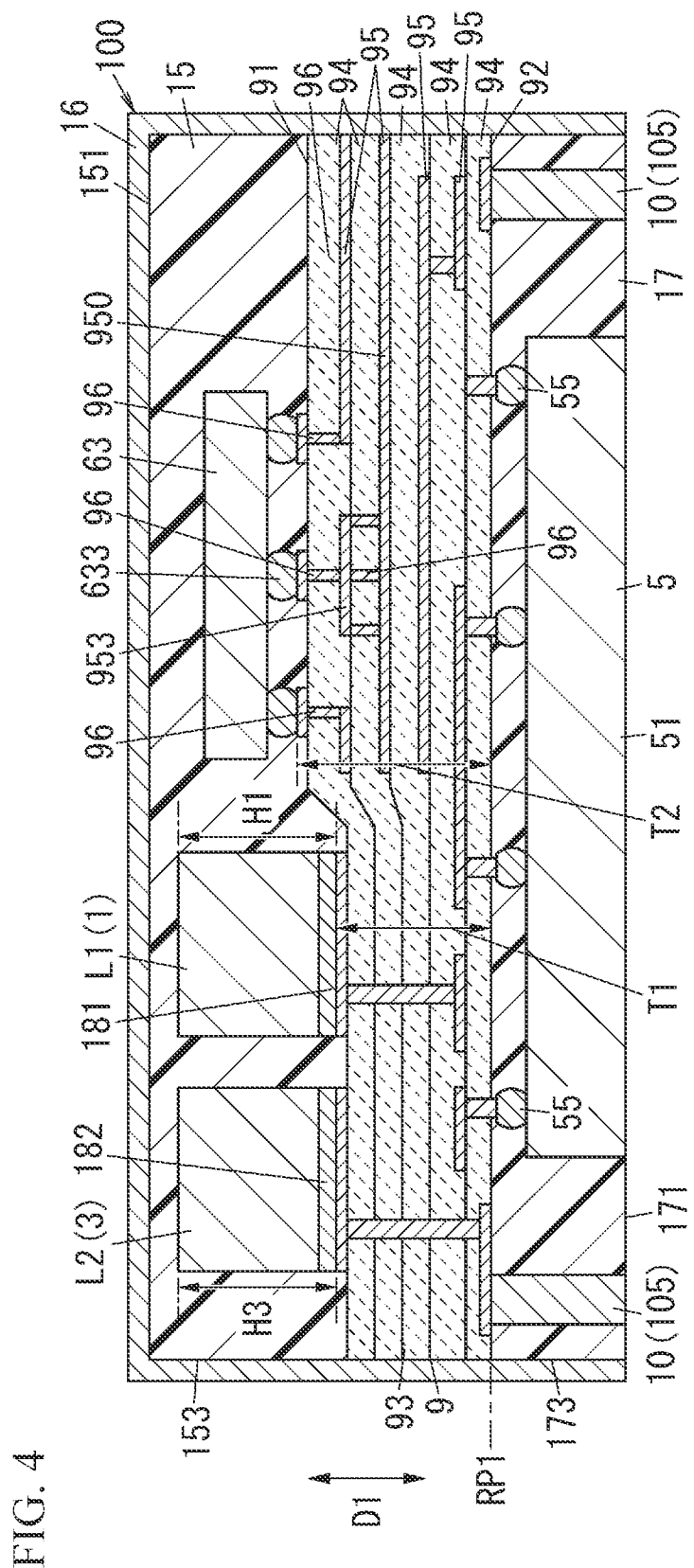
FIG. 4 is a sectional view of the radio-frequency module, taken along line X2-X2 in FIG. 1.
Figure 5:
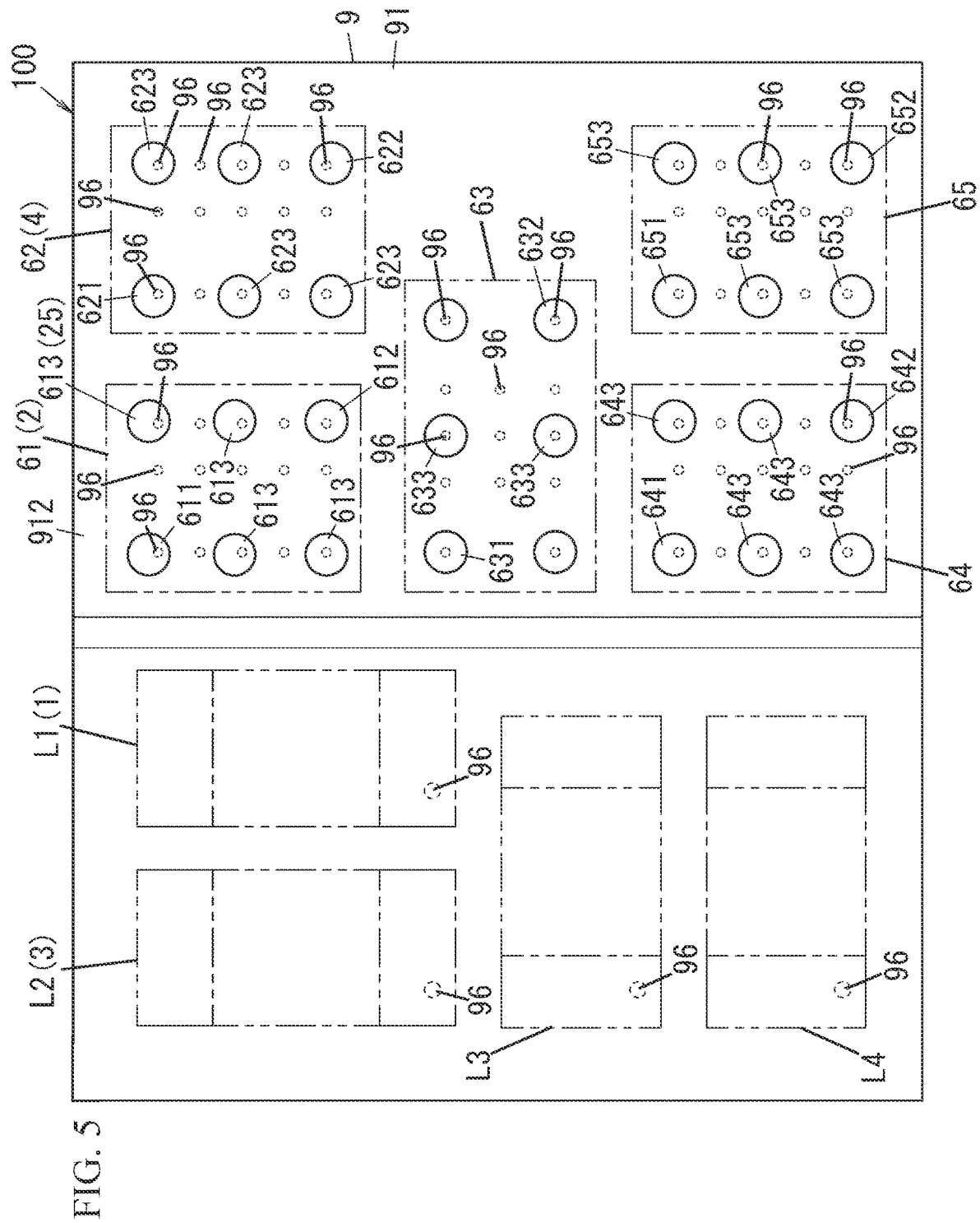
FIG. 5 is a plan view of the radio-frequency module, illustrating an arrangement of a plurality of via-conductors in a mounting board.

The radio-frequency module 100 according to the first embodiment further includes a plurality of external connection terminals 10 and a fifth electronic component 5 as illustrated in FIGS. 2 to 4. The external connection terminals 10 are disposed on the second major surface 92 of the mounting board 9. The fifth electronic component 5 is mounted on the second major surface 92 of the mounting board 9.

Figure 7:
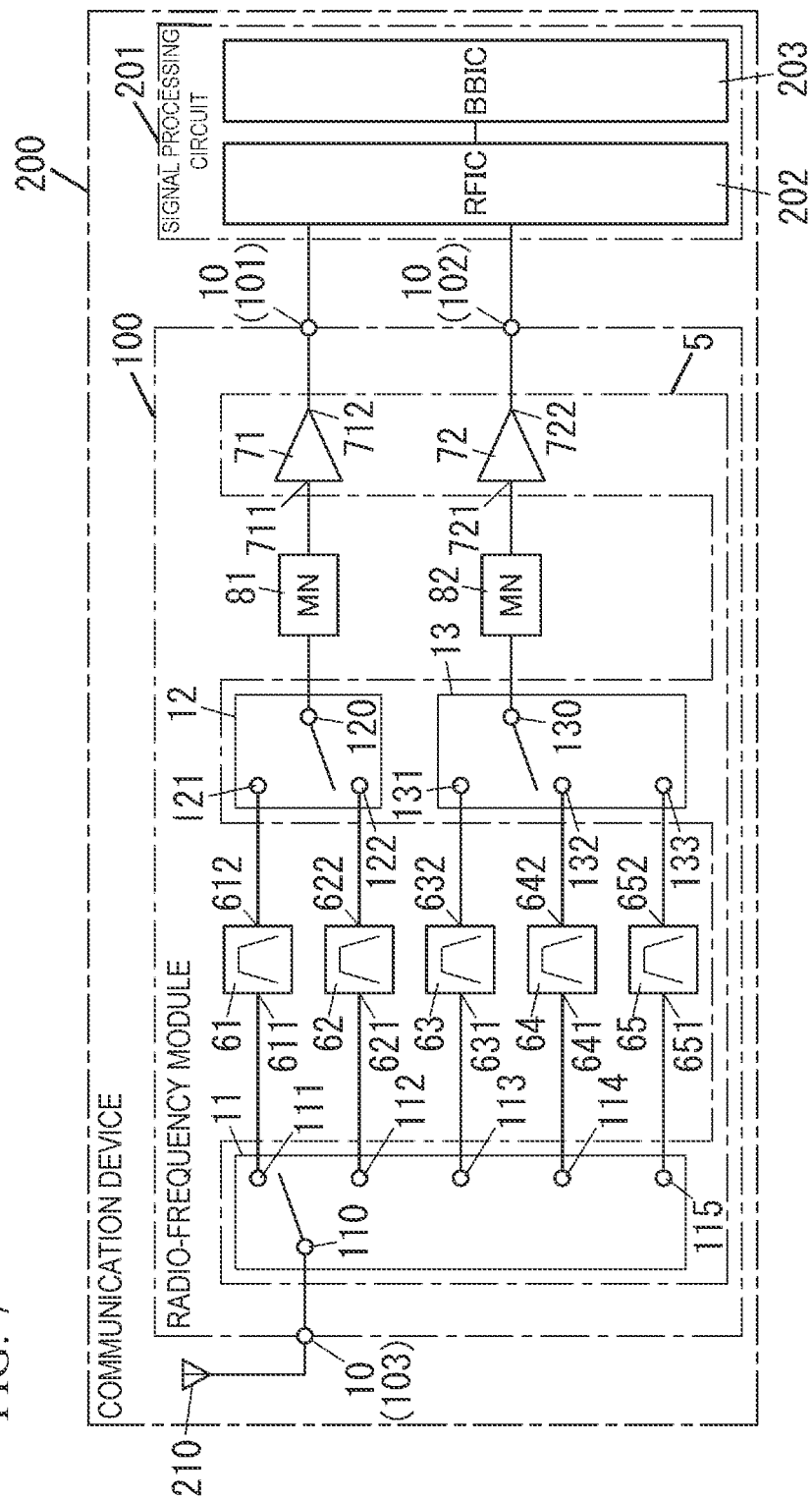
FIG. 7 is a circuit configuration diagram of a communication device including the radio-frequency module.

The radio-frequency module 100 may be used in, for example, a communication device 200 as illustrated in FIG. 7. The communication device 200 may be, for example, a mobile phone, such as a smartphone. The communication device 200 is not limited to this example and may be, for example, a wearable device, such as a smartwatch. The radio-frequency module 100 can support technology standards such as the fourth generation (4G) and fifth generation (5G) technology standards for cellular networks. Examples of the 4G standards include the 3rd Generation Partnership Project (3GPP) standard and the Long-Term Evolution (LTE) standard. Examples of the 5G standards include 5G New Radio (NR). The radio-frequency module 100 enables, for example, carrier aggregation and dual connectivity.

Hereinafter, the radio-frequency module 100 and the communication device 200 according to the first embodiment will be more specifically described with reference to FIGS. 1 to 7.

(1) Radio-Frequency Module
(1.1) Circuit Configuration of Radio-Frequency Module A circuit configuration of the radio-frequency module 100 according to the first embodiment will be described with reference to FIG. 7.

The radio-frequency module 100 is configured to, for example, amplify a receive signal inputted from an antenna 210 and output the receive signal to a signal processing circuit 201. The signal processing circuit 201 is not a constituent element of the radio-frequency module 100; the signal processing circuit 201 is a constituent element of the communication device 200 including the radio-frequency module 100. The radio-frequency module 100 is controlled by, for example, the signal processing circuit 201 included in the communication device 200.

The radio-frequency module 100 includes a plurality (five in the example in the drawing) of filters 61 to 65, a first switch 11, a second switch 12, a third switch 13, a plurality (two in the example in the drawing) of low-noise amplifiers 71 and 72, and two matching networks 81 and 82. The matching network 81 includes two inductors L1 and L2 (refer to FIG. 1). The matching network 82 includes two inductors L3 and L4 (refer to FIG. 1). In the radio-frequency module 100, the inductor L1 forms the first electronic component 1, and the filter 61 forms the second electronic component 2 (refer to FIGS. 1 and 3). Also, in the radio-frequency module 100, the inductor L2 forms the third electronic component 3, and the filter 62 forms the fourth electronic component 4 (refer to FIGS. 1 and 3). The fifth electronic component 5 is an integrated circuit (IC) chip including the first switch 11, the second switch 12, the third switch 13, and the low-noise amplifiers 71 and 72.

The radio-frequency module 100 includes the external connection terminals 10. The external connection terminals 10 include an antenna terminal 103, a first signal output terminal 101, a second signal output terminal 102, and a plurality of external ground terminals 105 (refer to FIGS. 3 and 4). The external ground terminals 105 are electrically coupled to, for example, a ground electrode of the circuit board included in the communication device 200 so that a ground potential is supplied to the external ground terminals 105.

The following more specifically describes the circuit configuration of the radio-frequency module 100.
(1.1.1) Filter The filters 61 to 65 are receive filters of different frequency ranges as pass bands. In the following, when the five filters 61 to 65 are distinctively described, the five filters 61 to 65 are also respectively referred to as the first filter 61, the second filter 62, the third filter 63, the fourth filter 64, and the fifth filter 65.

The pass band of the first filter 61 is, for example, a first frequency range (for example, a receive band of a first communication band). The pass band of the second filter 62 is, for example, a second frequency range (for example, a receive band of a second communication band). The pass band of the third filter 63 is, for example, a third frequency range (for example, a receive band of a third communication band). The pass band of the fourth filter 64 is, for example, a fourth frequency range (for example, a receive band of a fourth communication band). The pass band of the fifth filter 65 is, for example, a fifth frequency range (for example, a receive band of a fifth communication band). The first frequency range, the second frequency range, the third frequency range, the fourth frequency range, and the fifth frequency range are communication bands of, for example, the 3GPP LTE standard or the 5G NR standard.

The first filter 61 has an input terminal 611 and an output terminal 612. The first filter 61 has a plurality (for example, four) of ground terminals 613 (refer to FIGS. 3 and 5). The second filter 62 has an input terminal 621 and an output terminal 622. The second filter 62 has a plurality (for example, four) of ground terminals 623 (refer to FIGS. 3 and 5). The third filter 63 has an input terminal 631 and an output terminal 632. The third filter 63 has a plurality (for example, two) of ground terminals 633 (refer to FIG. 5). The fourth filter 64 has an input terminal 641 and an output terminal 642. The fourth filter 64 has a plurality (for example, four) of ground terminals 643 (refer to FIG. 5). The fifth filter 65 has an input terminal 651 and an output terminal 652. The fifth filter 65 has a plurality (for example, four) of ground terminals 653 (refer to FIG. 5).

(1.1.2) First Switch

The first switch 11 has a common terminal 110 and a plurality (five in the example in the drawing) of selection terminals 111 to 115. The common terminal 110 is coupled to the antenna terminal 103. The selection terminal 111 is coupled to the input terminal 611 of the first filter 61. The selection terminal 112 is coupled to the input terminal 621 of the second filter 62. The selection terminal 113 is coupled to the input terminal 631 of the third filter 63. The selection terminal 114 is coupled to the input terminal 641 of the fourth filter 64. The selection terminal 115 is coupled to the input terminal 651 of the fifth filter 65. The first switch 11 is configured to establish the connection between, for example, the common terminal 110 and at least one or more of the five selection terminals 111 to 115. Here, the first switch 11 is configured to establish the connection, for example, between one terminal and one terminal and between one terminal and a plurality of terminals.

The first switch 11 is controlled by, for example, the signal processing circuit 201. In accordance with a control signal from a radio-frequency (RF) signal processing circuit 202 of the signal processing circuit 201, the first switch 11 switches the connections between the common terminal 110 and the five selection terminals 111 to 115.

(1.1.3) Second Switch

The second switch 12 has a common terminal 120 and a plurality (two in the example in the drawing) of selection terminals 121 and 122. The common terminal 120 is coupled to an input terminal 711 of the low-noise amplifier 71 via the matching network 81. The selection terminal 121 is coupled to the output terminal 612 of the first filter 61. The selection terminal 122 is coupled to the output terminal 622 of the second filter 62. The second switch 12 is configured to establish the connection between, for example, the common terminal 120 and at least one or more of the two selection terminals 121 and 122. Here, the second switch 12 is configured to establish the connection, for example, between one terminal and one terminal and between one terminal and a plurality of terminals.

The second switch 12 is controlled by, for example, the signal processing circuit 201. In accordance with a control signal from the RF signal processing circuit 202 of the signal processing circuit 201, the second switch 12 switches the connections between the common terminal 120 and the two selection terminals 121 and 122.

(1.1.4) Third Switch

The third switch 13 has a common terminal 130 and a plurality (three in the example in the drawing) of selection terminals 131, 132, and 133. The common terminal 130 is coupled to an input terminal 721 of the low-noise amplifier 72 via the matching network 82. The selection terminal 131 is coupled to the output terminal 632 of the third filter 63. The selection terminal 132 is coupled to the output terminal 642 of the fourth filter 64. The selection terminal 133 is coupled to the output terminal 652 of the fifth filter 65. The third switch 13 is configured to establish the connection between, for example, the common terminal 130 and at least one or more of the three selection terminals 131, 132, and 133. Here, the third switch 13 is configured to establish the connection, for example, between one terminal and another terminal and between one terminal and a plurality of terminals.

The third switch 13 is controlled by, for example, the signal processing circuit 201. In accordance with a control signal from the RF signal processing circuit 202 of the signal processing circuit 201, the third switch 13 switches the connections between the common terminal 130 and the three selection terminals 131, 132, and 133.

(1.1.5) Low-Noise Amplifier

In the following, when the two low-noise amplifiers 71 and 72 are distinctively described, the two low-noise amplifiers 71 and 72 are also respectively referred to as the first low-noise amplifier 71 and the second low-noise amplifier 72.

The first low-noise amplifier 71 has the input terminal 711 and an output terminal 712. The first low-noise amplifier 71 amplifies a receive signal inputted to the input terminal 711 and outputs the receive signal from the output terminal 712. The first low-noise amplifier 71 corresponds to the first filter 61 and the second filter 62. The input terminal 711 of the first low-noise amplifier 71 is coupled to the first filter 61 and the second filter 62 via the matching network 81 and the second switch 12. The output terminal 712 of the first low-noise amplifier 71 is coupled to the first signal output terminal 101. The first low-noise amplifier 71 is consequently coupled to the signal processing circuit 201 via the first signal output terminal 101. The first signal output terminal 101 is used to output a radio-frequency signal (receive signal) from the first low-noise amplifier 71 to an external circuit (for example, the signal processing circuit 201).

The second low-noise amplifier 72 has the input terminal 721 and an output terminal 722. The second low-noise amplifier 72 amplifies a receive signal inputted to the input terminal 721 and outputs the receive signal from the output terminal 722. The second low-noise amplifier 72 corresponds to the third filter 63, the fourth filter 64, and the fifth filter 65. The input terminal 721 of the second low-noise amplifier 72 is coupled to the third filter 63, the fourth filter 64, and the fifth filter 65 via the matching network 82 and the third switch 13. The output terminal 722 of the second low-noise amplifier 72 is coupled to the second signal output terminal 102. The second low-noise amplifier 72 is consequently coupled to the signal processing circuit 201 via the second signal output terminal 102. The second signal output terminal 102 is used to output a radio-frequency signal (receive signal) from the second low-noise amplifier 72 to an external circuit (for example, the signal processing circuit 201).

(1.1.6) Matching Network

The matching network 81 is an impedance matching circuit for providing the impedance matching between the first filter 61 and the second filter 62, and the first low-noise amplifier 71. The matching network 81 includes, for example, the two inductors L1 and L2 (refer to FIG. 1). The inductor L1 is coupled between the common terminal 120 of the second switch 12 and the input terminal 711 of the first low-noise amplifier 71. This means that the inductor L1 is, for example, electrically coupled to both the common terminal 120 and the input terminal 711 between the common terminal 120 of the second switch 12 and the input terminal 711 of the first low-noise amplifier 71. The inductor L2 is, for example, coupled between the ground and a signal path between the common terminal 120 of the second switch 12 and the input terminal 711 of the first low-noise amplifier 71. The matching network 82 is an impedance matching circuit for providing the impedance matching between the third filter 63, the fourth filter 64, and the fifth filter 65, and the second low-noise amplifier 72. The matching network 82 includes, for example, the two inductors L3 and L4 (refer to FIG. 1). The inductor L3 is, for example, coupled between the common terminal 120 of the third switch 13 and the input terminal 721 of the second low-noise amplifier 72.

This means that the inductor L2 is electrically coupled to both the common terminal 130 and the input terminal 721 between the common terminal 130 of the third switch 13 and the input terminal 721 of the second low-noise amplifier 72. The inductor L4 is, for example, coupled between the ground and a signal path between the common terminal 130 of the third switch 13 and the input terminal 721 of the second low-noise amplifier 72.

(1.2) Structure of Radio-Frequency Module

As illustrated in FIGS. 1 to 6, the radio-frequency module 100 includes the mounting board 9 and a plurality (for example, ten) of electronic components. The ten electronic components include the first filter 61 (the second electronic component 2), the second filter 62 (the fourth electronic component 4), the third filter 63, the fourth filter 64, the fifth filter 65, the inductor L1 (the first electronic component 1), the inductor L2 (the third electronic component 3), the inductor L3, the inductor L4, and the fifth electronic component 5. The fifth electronic component 5 is an IC chip including the first switch 11 (refer to FIG. 4), the second switch 12 (refer to FIG. 4), the third switch 13 (refer to FIG. 4), and the two low-noise amplifiers 71 and 72. As illustrated in FIGS. 3 and 4, the radio-frequency module 100 includes the external connection terminals 10, a first resin layer 15, a second resin layer 17, and a metal electrode layer 16.

(1.2.1) Mounting Board

As illustrated in FIGS. 3 and 4, the mounting board 9 has the first major surface 91 and the second major surface 92 that are opposite to each other in the thickness direction D1 of the mounting board 9. The mounting board 9 includes a plurality of dielectric layers 94, a plurality of conductive layers 95, and a plurality of via-conductors 96. In the mounting board 9, the dielectric layers 94 and the conductive layers 95 are stacked one by one in an alternating manner in the thickness direction D1 of the mounting board 9. This means that the mounting board 9 is a multilayer substrate including the dielectric layers 94 and the conductive layers 95. The conductive layers 95 are shaped into given patterns designed for the respective conductive layers. Each conductive layer 95 includes one or more conductor portions. The mounting board 9 may be, for example, a low temperature co-fired ceramics (LTCC) substrate. When the mounting board 9 is an LTCC substrate, the dielectric layers may be made of, for example, a ceramic containing alumina and glass. The conductive layers 95 may be made of, for example, copper. The material of the conductive layers is not limited to copper, and may be, for example, silver. The mounting board 9 is not limited to an LTCC substrate, and may be, for example, a printed-circuit board, high temperature co-fired ceramics (HTCC) substrate, or resin multilayer substrate.

Figure 6:
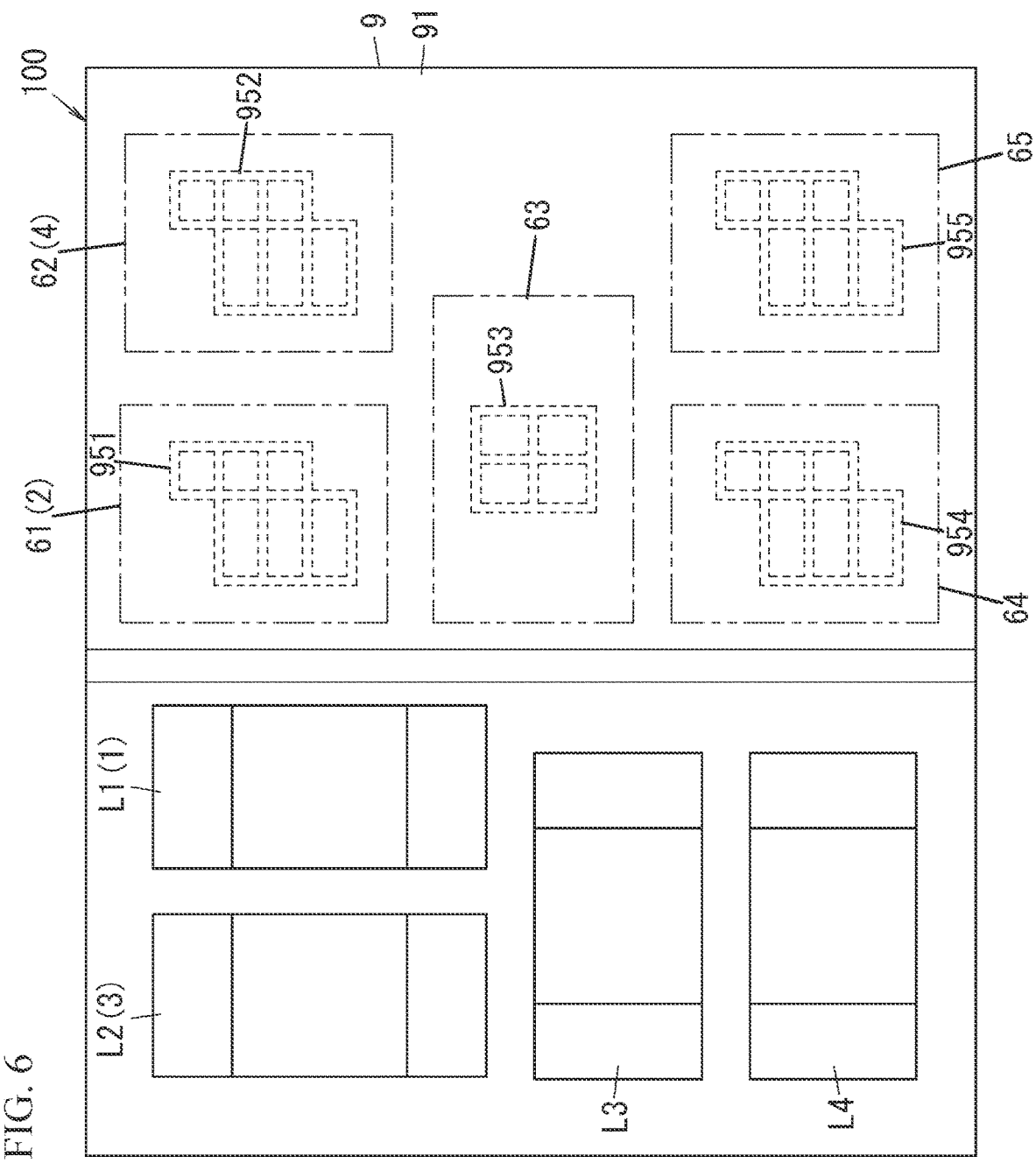
FIG. 6 is a plan view of the radio-frequency module, illustrating an arrangement of mesh-like ground electrodes in the mounting board.

In one of the conductive layers 95, the conductor portions include five ground electrodes 951 to 955 (refer to FIG. 6). As illustrated in FIG. 6, when viewed in plan view in the thickness direction D1 of the mounting board 9, the five ground electrodes 951 to 955 are each shaped as a mesh. More specifically, when viewed in plan view in the thickness direction D1 of the mounting board 9, the five ground electrodes 951 to 955 are each formed by a conductor portion having a plurality of cavities. In each of the five ground electrodes 951 to 955, the plurality of cavities may be identical to or different from each other with respect to shape. When viewed in plan view in the thickness direction D1 of the mounting board 9, the five ground electrodes 951 to 955 are each shaped as a grid having a plurality of cavities. The grid is shaped as a quadrangle grid. The grid is, however, not limited to this example, and may be shaped as, for example, a triangular or hexagonal grid. It should be noted that, when viewed in plan view in the thickness direction D1 of the mounting board 9, the five ground electrodes 951 to 955 are not necessarily shaped as grids, and the five ground electrodes 951 to 955 each only need to have a plurality of cavities.

The mounting board 9 also includes a ground electrode 950 (refer to FIGS. 3 and 4). In the thickness direction D1 of the mounting board 9, the ground electrode 950 overlaps the five ground electrodes 951 to 955 and is larger in area than the five ground electrodes 951 to 955. The ground electrode 950 and the five ground electrodes 951 to 955 serve as the circuit ground of the radio-frequency module 100. In the thickness direction D1 of the mounting board 9, the ground electrode 950 is disposed between the five ground electrodes 951 to 955 and the second major surface 92 of the mounting board 9 and spaced apart from the five ground electrodes 951 to 955 and the second major surface 92. When viewed in plan view in the thickness direction D1 of the mounting board 9, the ground electrode 950 is the largest conductor portion of all the conductor portions in the mounting board 9. When viewed in plan view in the thickness direction D1 of the mounting board 9, the area of the ground electrode 950 is larger than the total area of the five ground electrodes 951 to 955.

Some of the via-conductors 96 couple the five ground electrodes 951 to 955 to the ground electrode 950. Four of the via-conductors 96 couple the ground electrode 951 to the four ground terminals 613 of the first filter 61. Four of the via-conductors 96 couple the ground electrode 952 to the four ground terminals 623 of the second filter 62. Two of the via-conductors 96 couple the ground electrode 953 to the two ground terminals 633 of the third filter 63. Four of the via-conductors 96 couple the ground electrode 954 to the four ground terminals 643 of the fourth filter 64. Four of the via-conductors 96 couple the ground electrode 955 to the four ground terminals 653 of the fifth filter 65.

The ground electrode 950 and the five ground electrodes 951 to 955 are electrically coupled to the metal electrode layer 16.

When viewed in plan view in the thickness direction D1 of the mounting board 9, the perimeter of the mounting board 9 is shaped as a quadrangle. The mounting board 9 has the first region 901 overlapping the first electronic component 1 when viewed in plan view in the thickness direction D1 of the mounting board 9 and also has the second region 902 overlapping the second electronic component 2 when viewed in plan view in the thickness direction D1 of the mounting board 9. In the mounting board 9, the thickness T1 of the first region 901 is less than the thickness T2 of the second region 902. In the mounting board 9, the conductive layers 95 in the first region 901 are fewer than the conductive layers 95 in the second region 902. In the mounting board 9, the dielectric layers 94 in the first region 901 are equal in number to the dielectric layers 94 in the second region 902. The mounting board 9 has a thinner first portion 911 including the first region 901 and a thicker second portion 912 including the second region 902. As mentioned earlier, in the mounting board 9, the conductive layers 95 in the first region 901 are fewer than the conductive layers 95 in the second region 902, and as a result, the coplanarity of the first major surface 91 in the first region 901 tends to be less than the coplanarity of the first major surface 91 in the second region 902. This improves the mountability for electronic components mounted on the first major surface 91 in the first region 901 of the mounting board 9 and the reliability of connection between the mounting board 9 and joints in the radio-frequency module 100.

The first major surface 91 and the second major surface 92 of the mounting board 9 are away from each other in the thickness direction D1 of the mounting board 9. The first major surface 91 and the second major surface 92 of the mounting board 9 both cross the thickness direction D1 of the mounting board 9. The first major surface 91 of the mounting board 9 includes surfaces perpendicular to the thickness direction D1 of the mounting board 9 and a surface not perpendicular to the thickness direction D1. The second major surface 92 of the mounting board 9 may be, for example, perpendicular to the thickness direction D1 of the mounting board 9. The second major surface 92 may, however, include, for example, a side surface of a conductor portion as a surface not perpendicular to the thickness direction D1. For ease of description, a plane including at least a portion of the second major surface 92, perpendicular to the thickness direction D1 of the mounting board 9, is determined as a reference plane RP1 (refer to FIG. 3). In the mounting board 9, the distance between the reference plane RP1 in the first region 901 and the first major surface 91 corresponds to the thickness T1 of the first region 901, and the distance between the reference plane RP1 in the second region 902 and the second major surface 92 corresponds to the thickness T2 in the second region 902. Thus, in the mounting board 9, the distance between the reference plane RP1 in the first region 901 and the first major surface 91 is shorter than the distance between the reference plane RP1 in the second region 902 and the first major surface 91. Between the first region 901 and the second region 902 of the mounting board 9, a slope extends on the first major surface 91 of the mounting board 9 while the distance to the reference plane RP1 gradually changes. In the mounting board 9, the coplanarity of the second major surface 92 is less than the coplanarity of the first major surface 91.

In the radio-frequency module 100, nine out of the ten electronic components are mounted on the first major surface 91 of the mounting board 9, and the other one electronic component is mounted on the second major surface 92 of the mounting board 9. The expression "electronic components are mounted on the first major surface 91 of the mounting board 9" means that electronic components are disposed on (mechanically coupled to) the first major surface 91 of the mounting board 9 and also means that electronic components are electrically coupled to (any conductor portions of) the mounting board 9. The expression "electronic components are mounted on the second major surface 92 of the mounting board 9" means that electronic components are disposed on (mechanically coupled to) the second major surface 92 of the mounting board 9 and also means that electronic components are electrically coupled to (any conductor portions of) the mounting board 9.

(1.2.2) Filter

Each of the five filters 61 to 65 may be, for example, an acoustic wave ladder filter formed by coupling a plurality of acoustic wave resonators in a ladder; the plurality of acoustic wave resonators include a plurality (for example, five) of series arm resonators and a plurality (for example, four) of parallel arm resonators. The acoustic wave filter may be, for example, a surface acoustic wave filter using surface acoustic waves. In the surface acoustic wave filter, the plurality of series arm resonators and the plurality of parallel arm resonators are all, for example, surface acoustic wave (SAW) resonators.

When viewed in plan view in the thickness direction D1 of the mounting board 9, the perimeter of each of the five filters 61 to 65 is shaped as a quadrangle. The five filters 61 to 65 each include a substrate exhibiting piezoelectricity and a plurality of interdigital transducer (IDT) electrodes formed on the substrate exhibiting piezoelectricity. The filters 61 to 65 each include, as constituent elements of a package structure, a spacer layer, a cover member, and a plurality of external terminals. The spacer layer is formed on the substrate exhibiting piezoelectricity. The spacer layer is shaped as a rectangular frame extending along the outer edges of the substrate exhibiting piezoelectricity and disposed around the plurality of IDT electrodes. The spacer layer is electrically non-conductive. The material of the spacer layer may be, for example, epoxy resin or polyimide. The cover member is shaped as a plate. The cover member is disposed on the spacer layer, facing the substrate exhibiting piezoelectricity in the thickness direction of the substrate exhibiting piezoelectricity. The cover member overlaps the plurality of IDT electrodes in the thickness direction of the substrate exhibiting piezoelectricity, while the cover member is spaced apart from the plurality of IDT electrodes in the thickness direction of the substrate exhibiting piezoelectricity. The cover member is electrically non-conductive. The material of the cover member may be, for example, epoxy resin or polyimide. The plurality of external terminals are exposed from the cover member. Each external terminal includes a conductive bump. The material of the conductive bump may be, for example, solder, gold, or copper. A plurality (for example, six) of external terminals 610 of the first filter 61 (refer to FIG. 1) include the input terminal 611, the output terminal 612, and the four ground terminals 613 (refer to FIG. 5). In the radio-frequency module 100, the ground terminals 613 of the first filter 61 constitute a plurality of ground terminals 25 of the second electronic component 2. A plurality (for example, six) of external terminals 620 of the second filter 62 (refer to FIG. 1) include the input terminal 621, the output terminal 622, and the four ground terminals 623 (refer to FIG. 5). A plurality (for example, six) of external terminals 630 of the third filter 63 include the input terminal 631, the output terminal 632, and the two ground terminals 633 (refer to FIG. 5). A plurality (for example, six) of external terminals 640 of the fourth filter 64 (refer to FIG. 1) include the input terminal 641, the output terminal 642, and the four ground terminals 643 (refer to FIG. 5). A plurality (for example, six) of external terminals 650 of the fifth filter 65 (refer to FIG. 1) include the input terminal 651, the output terminal 652, and the four ground terminals 653. The five filters 61 to 65 are each not limited to the package structure, and may be formed as, for example, a chip (also referred to as a die).

The substrate exhibiting piezoelectricity is a piezoelectric substrate, such as a lithium tantalate substrate or lithium niobate substrate. The substrate exhibiting piezoelectricity is not limited to a piezoelectric substrate, and may include, for example, a substrate, a low acoustic velocity film formed on the substrate, and a piezoelectric layer formed on the low acoustic velocity film. The material of the substrate may be, for example, silicon. The material of the piezoelectric layer may be, for example, lithium niobate or lithium tantalate. The low acoustic velocity film is configured such the velocity of bulk waves propagating in the low acoustic velocity film is lower than the velocity of bulk waves propagating in the piezoelectric layer. The material of the low acoustic velocity film may be, for example, silicon oxide. The material of the low acoustic velocity film is, however, not limited to silicon oxide, and may include at least one material selected from the group consisting of tantalum oxide, and compounds made by adding fluorine, carbon, or boron to silicon oxide. The velocity of a bulk wave propagating in the substrate is higher than the velocity of acoustic waves propagating along the piezoelectric layer. The bulk wave propagating in the substrate here denotes one bulk wave of the lowest acoustic velocity of bulk waves propagating in the substrate.

The substrate exhibiting piezoelectricity may further include a high acoustic velocity film disposed between the substrate and the low acoustic velocity film. The high acoustic velocity film is configured such the velocity of bulk waves propagating in the high acoustic velocity film is lower than the velocity of acoustic waves propagating along the piezoelectric layer. The material of the high acoustic velocity film may be, for example, silicon nitride. The material of the high acoustic velocity film is, however, not limited to silicon nitride, and may include at least one material selected from the group consisting of diamond-like carbon, aluminum nitride, silicon carbide, silicon nitride, silicon oxynitride, silicon, sapphire, lithium tantalate, lithium niobate, quartz-crystal, zirconia, cordierite, mullite, steatite, forsterite, magnesia, and diamond.

The five filters 61 to 65 each may include, for example, a fixing layer interposed between the low acoustic velocity film and the piezoelectric layer. The fixing layer may be made of, for example, resin (epoxy resin, polyimide resin). The filters 61 to 65 each may include a dielectric film between the low acoustic velocity film and the piezoelectric layer, on the piezoelectric layer, or under the low acoustic velocity film.

(1.2.3) Inductor

The four inductors L1 to L4 illustrated in FIG. 1 are, for example, chip inductors. The four inductors L1 to L4 are thus surface mount devices (SMDs). The four inductors L1 to L4 are each shaped as a rectangular parallelepiped. When viewed in plan view in the thickness direction D1 of the mounting board 9, the perimeter of each of the four inductors L1 to L4 is shaped as a quadrangle.

The inductor L1 has the two external terminals 141. The inductor L1 is mounted on the first major surface 91 of the mounting board 9 such that the two external terminals 141 are joined to the first major surface 91 of the mounting board 9 by two joints 181 (refer to FIGS. 3 and 4) provided in one-to-one correspondence with the two external terminals 141. The material of the joints 181 may be, for example, solder.

The inductor L2 has two external terminals 142. The inductor L2 is mounted on the first major surface 91 of the mounting board 9 such that the two external terminals 142 are joined to the first major surface 91 of the mounting board 9 by two joints 182 (refer to FIGS. 3 and 4) provided in one-to-one correspondence with the two external terminals 142. The material of the joints 182 may be, for example, solder.

The inductor L3 has two external terminals 143. The inductor L3 is mounted on the first major surface 91 of the mounting board 9 such that the two external terminals 143 are joined to the first major surface 91 of the mounting board 9 by two joints (not illustrated in the drawings) provided in one-to-one correspondence with the two external terminals 143. The material of the joints may be, for example, solder.

The inductor L4 has two external terminals 144. The inductor L4 is mounted on the first major surface 91 of the mounting board 9 such that the two external terminals 144 are joined to the first major surface 91 of the mounting board 9 by two joints (not illustrated in the drawings) provided in one-to-one correspondence with the two external terminals 144. The material of the joints may be, for example, solder.

(1.2.4) Fifth Electronic Component

The fifth electronic component 5 is an IC chip including the first switch 11 (refer to FIG. 7), the second switch 12 (refer to FIG. 7), the third switch 13 (refer to FIG. 7), and the two low-noise amplifiers 71 and 72. The fifth electronic component 5 is an Si-based IC chip. When viewed in plan view in the thickness direction D1 of the mounting board 9, the perimeter of the fifth electronic component 5 is shaped as a quadrangle.

The fifth electronic component 5 is flip-chip mounted on the second major surface 92 of the mounting board 9. In the radio-frequency module 100, the fifth electronic component 5 is coupled to the mounting board 9 by a plurality of conductive bumps 55 (refer to FIGS. 2 and 4). The material of the conductive bumps 55 may be, for example, solder, gold, or copper. The conductive bumps 55 do not constitute the fifth electronic component 5, but may constitute the fifth electronic component 5.

(1.2.5) External Connection Terminal

As illustrated in FIGS. 2 to 4, the external connection terminals 10 are disposed on the second major surface 92 of the mounting board 9. The expression "the external connection terminals 10 are disposed on the second major surface 92 of the mounting board 9" means that the external connection terminals 10 are mechanically coupled to the second major surface 92 of the mounting board 9 and also means that the external connection terminals 10 are electrically coupled to (any conductor portions of) the mounting board 9. The material of the external connection terminals 10 may be, for example, metal (for example, copper or a copper alloy). The external connection terminals 10 are all columnar electrodes. The columnar electrodes may be, for example, cylindrical electrodes. The external connection terminals 10 may be joined to conductor portions in the mounting board 9 by, for example, solder; but this should not be construed in a limiting sense, and the external connection terminals 10 may be joined by, for example, conductive adhesive (for example, conductive paste) or directly to the conductor portions in the mounting board 9. When viewed in plan view in the thickness direction D1 of the mounting board 9, the external connection terminals 10 are each shaped as a circle.

The external connection terminals 10 include the antenna terminal 103 (refer to FIG. 7), the first signal output terminal 101 (refer to FIG. 7), the second signal output terminal 102 (refer to FIG. 7), and the external ground terminals 105. The external ground terminals 105 are electrically coupled to the ground electrode 950 (refer to FIG. 3) and the five ground electrodes 951 to 955 (refer to FIG. 6) in the mounting board 9.

(1.2.6) First Resin Layer

As illustrated in FIGS. 3 and 4, the first resin layer 15 is disposed on the first major surface 91 of the mounting board 9. The first resin layer 15 covers nine electronic components mounted on the first major surface 91 of the mounting board 9. The nine electronic components include the first filter 61 (the second electronic component 2), the second filter 62 (the fourth electronic component 4), the third filter 63, the fourth filter 64, the fifth filter 65, the inductor L1 (the first electronic component 1), the inductor L2 (the third electronic component 3), the inductor L3, and the inductor L4. The first resin layer 15 contains a resin (for example, an epoxy resin). The first resin layer 15 may contain a filler in addition to the resin.

(1.2.7) Second Resin Layer

As illustrated in FIGS. 3 and 4, the second resin layer 17 covers outer surfaces of the fifth electronic component 5 and outer surfaces of the external connection terminals 10, which are mounted on the second major surface 92 of the mounting board 9. The outer surfaces of the fifth electronic component 5 include the four sides of the fifth electronic component 5. The second resin layer 17 does not cover a major surface 51 opposite to the mounting board 9, of the fifth electronic component 5. Of the second resin layer 17, a major surface 171 opposite to the mounting board 9 is substantially flush with the major surface 51 of the fifth electronic component 5. The second resin layer 17 contains a resin (for example, an epoxy resin). The second resin layer 17 may contain a filler in addition to the resin. The material of the second resin layer 17 may be identical to or different from the material of the first resin layer 15.

(1.2.8) Metal Electrode Layer

As illustrated in FIGS. 3 and 4, the metal electrode layer 16 covers the first resin layer 15. The metal electrode layer 16 is coupled to the external ground terminals 105 via the ground electrode 950 in the mounting board 9. The metal electrode layer 16 is conductive. In the radio-frequency module 100, the metal electrode layer 16 is a shield layer provided for electromagnetic shielding between the inside and outside of the radio-frequency module 100. The metal electrode layer 16 has a multilayer structure formed by stacking a plurality of metal layers; but this should not be construed in a limiting sense, and the metal electrode layer 16 may be formed by one metal layer. The metal layer contains one or more kinds of metals. When the metal electrode layer 16 has a multilayer structure formed by stacking a plurality of metal layers, the metal electrode layer 16 may include, for example, a first stainless steel layer on the first resin layer 15, a Cu layer on the first stainless steel layer, and a second stainless steel layer on the Cu layer. The material of the first stainless steel layer and the second stainless steel layer is an alloy containing Fe, Ni, and Cr. When the metal electrode layer 16 is formed by one metal layer, the metal electrode layer 16 may be, for example, a Cu layer. The metal electrode layer 16 is in contact with at least a portion of the outer surfaces of the ground electrode 950 in the mounting board 9. As a result, in the radio-frequency module 100, the metal electrode layer 16 can be configured such that the electric potential at the metal electrode layer 16 is almost identical to the electric potential at the ground electrode 950 and the five ground electrodes 951 to 955 in the mounting board 9.

(1.3) Layout of Radio-Frequency Module

In the radio-frequency module 100, as illustrated in FIG. 1, of the nine electronic components disposed on the first major surface 91 of the mounting board 9, four electronic components of higher heights overlap the first region 901 of the mounting board 9 when viewed in plan view in the thickness direction D1 of the mounting board 9. In the radio-frequency module 100, as illustrated in FIG. 1, of the nine electronic components disposed on the first major surface 91 of the mounting board 9, five electronic components of lower heights overlap the second region 902 of the mounting board 9 when viewed in plan view in the thickness direction D1 of the mounting board 9. The four electronic components of higher heights of the nine electronic components include the inductor L1 (the first electronic component 1), the inductor L2 (the third electronic component 3), the inductor L3, and the inductor L4. The four electronic components of higher heights may include electronic components identical to or different from the first electronic component 1 with respect to height. The five electronic components of lower heights of the nine electronic components include the first filter 61 (the second electronic component 2), the second filter 62 (the fourth electronic component 4), the third filter 63, the fourth filter 64, and the fifth filter 65. The five electronic components of lower heights may include electronic components identical to or different from the second electronic component 2 with respect to height. When viewed in plan view in the thickness direction D1 of the mounting board 9, the first region 901 is, for example, an imaginary polygonal region including the four electronic components of higher heights of the nine electronic components, as indicated by a dot-dash line in FIG. 1. The line (dot-dash line) indicating the perimeter of the first region 901 include line segments along portions of the perimeter of each of the four electronic components and line segments of the shortest distances between respective two adjacent electronic components. When viewed in plan view in the thickness direction D1 of the mounting board 9, the second region 902 is, for example, an imaginary polygonal region including the five electronic components of lower heights of the nine electronic components, as indicated by a dot-dash line in FIG. 1. The line (dot-dash line) indicating the perimeter of the second region 902 include line segments along portions of the perimeter of each of the five electronic components and line segments of the shortest distances between respective two adjacent electronic components. In FIG. 1, for the sake of clarity of illustration, the line segments along portions of the perimeter of each electronic component are illustrated apart from the perimeter of the electronic component.

In the radio-frequency module 100, when viewed in plan view in the thickness direction D1 of the mounting board 9, the first electronic component 1 is adjacent to the third electronic component 3, and the second electronic component 2 is adjacent to the fourth electronic component 4. The expression "the first electronic component 1 is adjacent to the third electronic component 3" means that, when viewed in plan view in the thickness direction D1 of the mounting board 9, the first electronic component 1 and the third electronic component 3 are next to each other without any electronic component disposed between the first electronic component 1 and the third electronic component 3 on the first major surface 91 of the mounting board 9. The expression "the second electronic component 2 is adjacent to the fourth electronic component 4" means that, when viewed in plan view in the thickness direction D1 of the mounting board 9, the second electronic component 2 and the fourth electronic component 4 are next to each other without any electronic component disposed between the second electronic component 2 and the fourth electronic component 4 on the first major surface 91 of the mounting board 9. The first region 901 of the mounting board 9 overlaps the first electronic component 1 and the third electronic component 3 when viewed in plan view in the thickness direction D1 of the mounting board 9. The second region 902 of the mounting board 9 overlaps the second electronic component 2 and the fourth electronic component 4 when viewed in plan view in the thickness direction D1 of the mounting board 9. In the radio-frequency module 100, the first electronic component 1 is not necessarily the inductor L1; the first electronic component 1 only needs to be any one of the four electronic components of higher heights. Furthermore, in the radio-frequency module 100, the third electronic component 3 is not necessarily the inductor L2; the third electronic component 3 only needs to be an electronic component adjacent to the first electronic component 1, of the four electronic components of higher heights, when viewed in plan view in the thickness direction D1 of the mounting board 9. Further, in the radio-frequency module 100, the second electronic component 2 is not necessarily the first filter 61; the second electronic component 2 only needs to be any one of the five electronic components of lower heights. Moreover, in the radio-frequency module 100, the fourth electronic component 4 is not necessarily the second filter 62; the fourth electronic component 4 only needs to be an electronic component adjacent to the second electronic component 2, of the five electronic components of lower heights, when viewed in plan view in the thickness direction D1 of the mounting board 9. In the radio-frequency module 100, of the nine electronic components disposed on the first major surface 91 of the mounting board 9, one or more electronic components of lower heights may overlap the first portion 911 when viewed in plan view in the thickness direction D1 of the mounting board 9.

In the mounting board 9, the via-conductors 96 in the first region 901 are fewer than the via-conductors 96 in the second region 902, when viewed in plan view in the thickness direction D1 of the mounting board 9. When viewed in plan view in the thickness direction D1 of the mounting board 9, the via-conductors 96 each may be shaped as, for example, a circle.

In the radio-frequency module 100, when viewed in plan view in the thickness direction D1 of the mounting board 9, the first filter 61 overlaps the ground electrode 951. In the radio-frequency module 100, when viewed in plan view in the thickness direction D1 of the mounting board 9, a portion of the first filter 61 coincides with the entire ground electrode 951; but this should not be construed in a limiting sense, and a portion of the first filter 61 may overlap a portion of the ground electrode 951. In the radio-frequency module 100, when viewed in plan view in the thickness direction D1 of the mounting board 9, the second filter 62 overlaps the ground electrode 952. In the radio-frequency module 100, when viewed in plan view in the thickness direction D1 of the mounting board 9, a portion of the second filter 62 coincides with the entire ground electrode 952; but this should not be construed in a limiting sense, and a portion of the second filter 62 may overlap a portion of the ground electrode 952. In the radio-frequency module 100, when viewed in plan view in the thickness direction D1 of the mounting board 9, the third filter 63 overlaps the ground electrode 953. In the radio-frequency module 100, when viewed in plan view in the thickness direction D1 of the mounting board 9, a portion of the third filter 63 coincides with the entire ground electrode 953; but this should not be construed in a limiting sense, and a portion of the third filter 63 may overlap a portion of the ground electrode 953. In the radio-frequency module 100, when viewed in plan view in the thickness direction D1 of the mounting board 9, the fourth filter 64 overlaps the ground electrode 954. In the radio-frequency module 100, when viewed in plan view in the thickness direction D1 of the mounting board 9, a portion of the fourth filter 64 coincides with the entire ground electrode 954; but this should not be construed in a limiting sense, and a portion of the fourth filter 64 may overlap a portion of the ground electrode 954. In the radio-frequency module 100, when viewed in plan view in the thickness direction D1 of the mounting board 9, the fifth filter 65 overlaps the ground electrode 955. In the radio-frequency module 100, when viewed in plan view in the thickness direction D1 of the mounting board 9, a portion of the fifth filter 65 coincides with the entire ground electrode 955; but this should not be construed in a limiting sense, and a portion of the fifth filter 65 may overlap a portion of the ground electrode 955.

In the radio-frequency module 100, the fifth electronic component 5 disposed on the second major surface 92 of the mounting board 9 overlaps a portion of the first region 901 and a portion of the second region 902 of the mounting board 9, when viewed in plan view in the thickness direction D1 of the mounting board 9. When viewed in plan view in the thickness direction D1 of the mounting board 9, the fifth electronic component 5 overlaps at least a portion of each of the nine electronic components disposed on the first major surface 91 of the mounting board 9.

In the radio-frequency module 100, the external connection terminals 10 are arranged along the perimeter of the mounting board 9 on the second major surface 92 of the mounting board 9. When viewed in plan view in the thickness direction D1 of the mounting board 9, the external connection terminals 10 are arranged around the fifth electronic component 5, between the fifth electronic component 5 and the perimeter of the mounting board 9.

(2) Effects

The radio-frequency module 100 according to the first embodiment includes the mounting board 9, the first electronic component, and the second electronic component 2. The mounting board 9 has the first major surface 91 and the second major surface 92 opposite to each other. The first electronic component 1 is disposed on the first major surface 91 of the mounting board 9. The second electronic component 2 is disposed on the first major surface 91 of the mounting board 9. The second electronic component 2 is lower in height than the first electronic component 1. The mounting board 9 includes the dielectric layers 94, the conductive layers 95, and the via-conductors 96. In the mounting board 9, the dielectric layers 94 and the conductive layers 95 are stacked in the thickness direction D1 of the mounting board 9. The mounting board 9 has the first region 901 and the second region 902. The first region 901 overlaps the first electronic component 1 when viewed in plan view in the thickness direction D1 of the mounting board 9 and extends from the first major surface 91 to the second major surface 92. The second region 902 overlaps the second electronic component 2 when viewed in plan view in the thickness direction D1 of the mounting board 9 and extends from the first major surface 91 to the second major surface 92. In the mounting board 9, the conductive layers 95 in the first region 901 are fewer than the conductive layers 95 in the second region 902. In the mounting board 9, the thickness T1 of the first region 901 is less than the thickness T2 of the second region 902.

The radio-frequency module 100 can achieve a low-profile structure. More specifically, in the radio-frequency module 100, the height H1 of the first electronic component 1 is more than the height H2 of the second electronic component 2; in the mounting board 9, when viewed in plan view in the thickness direction D1 of the mounting board 9, the thickness T1 of the first region 901 overlapping the first electronic component 1 is less than the thickness T2 of the second region 902 overlapping the second electronic component 2; accordingly, the radio-frequency module 100 can achieve a low-profile structure.

In the radio-frequency module 100, because the conductive layers 95 in the first region 901 of the mounting board 9 are fewer than the conductive layers 95 in the second region 902 of the mounting board 9, although the dielectric layers 94 in the first region 901 are equal in number to the dielectric layers 94 in the second region 902, the thickness T1 of the first region 901 can be less than the thickness T2 of the second region 902. With this structure, the radio-frequency module 100 can be configured such that the thickness T1 of the first region 901 of the mounting board 9 is less than the thickness T2 of the second region 902, without forming through-holes, which make the first region 901 thinner than the second region 902, in one or more of dielectric sheets (for example, ceramic green sheets or resin sheets) used to form the dielectric layers 94 in the manufacturing process of the mounting board 9. Further, because in the radio-frequency module 100 the conductive layers 95 in the first region 901 are fewer than the conductive layers 95 in the second region 902, it is possible to reduce the parasitic capacitance formed by the conductive layers 95 in the first region 901. For example, in the radio-frequency module 100, it is possible to reduce the parasitic capacitance between two conductive layers 95 overlapping in the mounting board 9 in the thickness direction D1 of the mounting board 9, or between the first electronic component 1 mounted on the mounting board 9 and the conductive layers 95.

The radio-frequency module 100 further includes the third electronic component 3 and the fourth electronic component 4 that are disposed on the first major surface 91 of the mounting board 9. In the radio-frequency module 100, the height H3 of the third electronic component 3 is more than the height H2 of the second electronic component 2, and the height H4 of the fourth electronic component 4 is less than each of the height H1 of the first electronic component 1 and the height H3 of the third electronic component 3. In the radio-frequency module 100, when viewed in plan view in the thickness direction D1 of the mounting board 9, the first electronic component 1 is adjacent to the third electronic component 3, and the second electronic component 2 is adjacent to the fourth electronic component 4. In the radio-frequency module 100, the first region 901 of the mounting board 9 overlaps the first electronic component 1 and the third electronic component 3 when viewed in plan view in the thickness direction D1 of the mounting board 9, and the second region 902 overlaps the second electronic component 2 and the fourth electronic component 4 when viewed in plan view in the thickness direction D1 of the mounting board 9. As a result, when the radio-frequency module 100 further includes the third electronic component 3 higher in height than the second electronic component 2, the first region 901 of the mounting board 9 can be easily made.

In the mounting board 9 of the radio-frequency module 100, the via-conductors 96 in the first region 901 are fewer than the via-conductors 96 in the second region 902, when viewed in plan view in the thickness direction D1 of the mounting board 9. Accordingly, the radio-frequency module 100 can be easily configured such that the thickness T1 of the first region 901 is less than the thickness T2 of the second region 902. More specifically, in the manufacturing process of the mounting board 9, for example, when the via-conductors 96 are raised in the process of firing a multilayer body formed by pressing a stack of ceramic green sheets, it is possible to suppress the increase in thickness caused by the raised via-conductors 96 in the entire first region 901 more than in the second region 902. As a result, the radio-frequency module 100 can be easily configured such that the thickness T1 of the first region 901 is less than the thickness T2 of the second region 902.

In the radio-frequency module 100, at least one of the conductive layers 95 includes the ground electrode 951 in the second region 902 of the mounting board 9. When viewed in plan view in the thickness direction D1 of the mounting board 9, the ground electrode 951 is shaped as a mesh. With this structure, when the mounting board 9 is manufactured by stacking and pressure bonding a plurality of dielectric sheets to be formed as the dielectric layers 94 of the mounting board 9, the material of the dielectric layers 94 partly enters the plurality of cavities of the mesh-like ground electrode 951. As a result, it is possible to further reduce the thickness T2 of the second region 902 of the mounting board 9 in the radio-frequency module 100. As such, the radio-frequency module 100 can further reduce its height.

In the radio-frequency module 100, the second electronic component 2 has the ground terminals 25 coupled to the ground electrode 951. With this configuration, the radio-frequency module 100 can suppress variations in the characteristics of the second electronic component 2. More specifically, it is possible to reduce the parasitic inductance of conductor portions to which the ground potential is supplied by the ground terminals 25 of the second electronic component 2 coupled to the conductor portions, and as a result, the radio-frequency module 100 can suppress variations in the potential at the conductor portions to which the ground potential is supplied. With this configuration, the radio-frequency module 100 can suppress the degradation of the characteristics of the second electronic component 2. More specifically, the radio-frequency module 100 can reduce losses in the pass band of the filter 61 constituting the second electronic component 2, and also suppress the degradation of the attenuation characteristic.

The radio-frequency module 100 includes the ground electrode 950 larger than the ground electrode 951. The ground electrode 950 overlaps the ground electrode 951 in the thickness direction D1 of the mounting board 9. In the thickness direction D1 of the mounting board 9, the ground electrode 950 is disposed between the ground electrode 951 and the second major surface 92 of the mounting board 9 and spaced apart from the ground electrode 951 and the second major surface 92. With this configuration, because it is possible to reduce the parasitic inductance of conductor portions to which the ground potential is supplied, the radio-frequency module 100 can suppress variations in the potential at the conductor portions to which the ground potential is supplied; as a result, it is possible to suppress the degradation of the characteristics of the second electronic component 2 (the first filter 61). Additionally, the radio-frequency module 100 can reduce the parasitic capacitance formed between the ground electrode 951 and the second electronic component 2 and the parasitic capacitance formed between the ground electrode 951 and the ground electrode 950.

(3) Communication Device

The communication device 200 according to the first embodiment includes the signal processing circuit 201 and the radio-frequency module 100. The signal processing circuit 201 is coupled to the radio-frequency module 100.

The communication device 200 further includes the antenna 210. The communication device 200 further includes a circuit board having the radio-frequency module 100. The circuit board may be, for example, a printed-circuit board. The circuit board has a ground electrode to which the ground potential is supplied.

The signal processing circuit 201 includes, for example, the RF signal processing circuit 202 and a baseband signal processing circuit 203. The RF signal processing circuit 202 is, for example, a radio frequency integrated circuit (RFIC) and processes radio-frequency signals. The RF signal processing circuit 202 processes by, for example, up-conversion a radio-frequency signal (transmit signal) outputted by the baseband signal processing circuit 203 and outputs the processed radio-frequency signal. The RF signal processing circuit 202 also processes by, for example, down-conversion a radio-frequency signal (receive signal) outputted by the radio-frequency module 100 and outputs the processed radio-frequency signal to the baseband signal processing circuit 203. The baseband signal processing circuit 203 may be, for example, a baseband integrated circuit (BBIC). The baseband signal processing circuit 203 generates an in-phase signal and a quadrature-phase signal from a baseband signal. The baseband signal may be, for example, a sound signal or image signal inputted from outside. The baseband signal processing circuit 203 performs IQ modulation by adding an in-phase signal and a quadrature-phase signal together and outputs a transmit signal. At this time, the transmit signal is a modulated signal (IQ signal) generated by amplitude modulating a carrier wave signal of a given frequency by a period longer than the period of the carrier wave signal. The receive signal processed by the baseband signal processing circuit 203 is used as, for example, an image signal for displaying an image, or a sound signal for talk by a user of the communication device 200. The radio-frequency module 100 transfers radio-frequency signals (receive and transmit signals) between the antenna 210 and the RF signal processing circuit 202 of the signal processing circuit 201.

Because the communication device 200 according to the first embodiment includes the radio-frequency module 100 and the signal processing circuit 201, the communication device 200 can achieve a low-profile structure.

Second Embodiment

Figure 8:
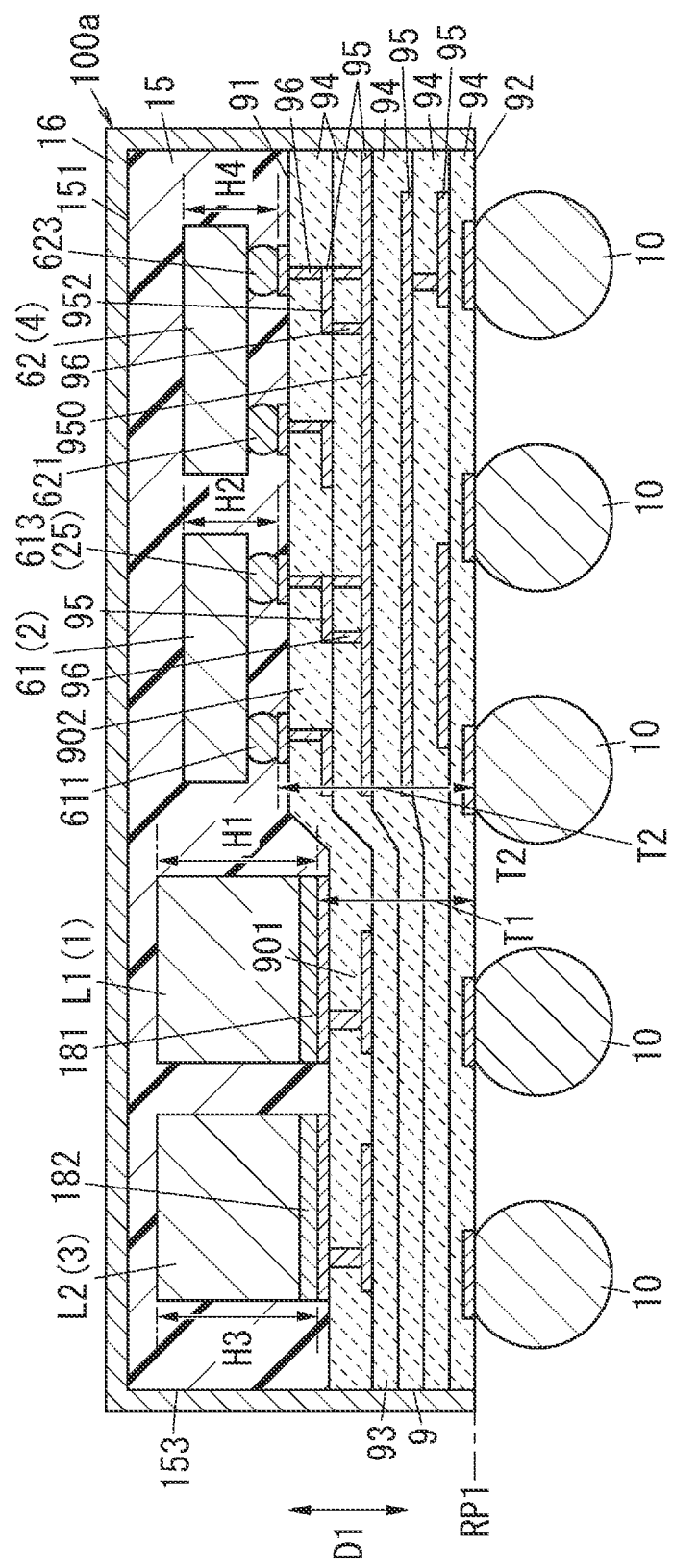
FIG. 8 is a sectional view of a radio-frequency module according to a second embodiment.

A radio-frequency module 100a according to a second embodiment will be described with reference to FIG. 8. Regarding the radio-frequency module 100a according to the second embodiment, the same reference characters are assigned to the same constituent elements as the radio-frequency module 100 according to the first embodiment, and descriptions thereof are not repeated.

The radio-frequency module 100a according to the second embodiment differs from the radio-frequency module 100 according to the first embodiment in that the external connection terminals 10 are ball bumps. The radio-frequency module 100a according to the second embodiment differs from the radio-frequency module 100 according to the first embodiment also in not including the second resin layer 17 of the radio-frequency module 100 according to the first embodiment. The radio-frequency module 100a according to the second embodiment may include an underfill deposited in the gap between the second major surface 92 of the mounting board 9 and the fifth electronic component 5 mounted on the second major surface 92 of the mounting board 9.

The material of the ball bumps respectively forming the external connection terminals 10 may be, for example, gold, copper, or solder.

The external connection terminals 10 may include both the external connection terminals 10 formed by ball bumps and the external connection terminals 10 formed by columnar electrodes.

In the radio-frequency module 100a according to the second embodiment, as with the radio-frequency module 100 according to the first embodiment, the thickness T1 of the first region 901 of the mounting board 9 is less than the thickness T2 of the second region 902 of the mounting board 9, and thus, the radio-frequency module 100a according to the second embodiment can achieve a low-profile structure.

Third Embodiment

Figure 9:
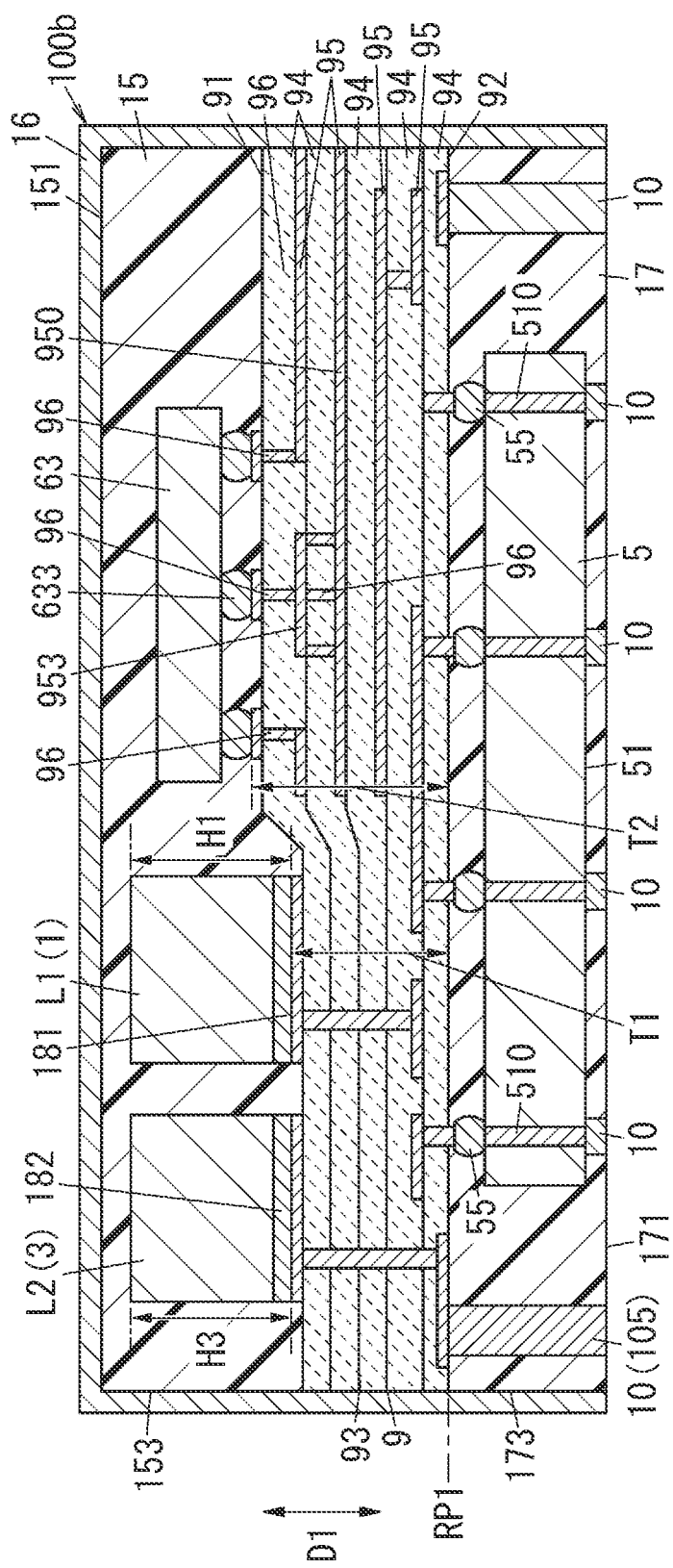
FIG. 9 is a sectional view of a radio-frequency module according to a third embodiment.

A radio-frequency module 100b according to a third embodiment will be described with reference to FIG. 9. Regarding the radio-frequency module 100b according to the third embodiment, the same reference characters are assigned to the same constituent elements as the radio-frequency module 100 according to the first embodiment, and descriptions thereof are not repeated.

The radio-frequency module 100b according to the third embodiment differs from the radio-frequency module 100 according to the first embodiment in that the fifth electronic component 5 has a plurality of through electrodes 510 in the thickness direction D1 of the mounting board 9. The radio-frequency module 100b differs from the radio-frequency module 100 in that some of the external connection terminals 10 are disposed on the major surface 51 opposite to the mounting board 9, of the fifth electronic component 5, and coupled to the through electrodes 510 overlapping the some of the external connection terminals 10 in the thickness direction D1 of the mounting board 9.

The fifth electronic component 5 is an Si-based IC chip. The through electrodes 510 may be, for example, through silicon vias (TSVs). The external connection terminals 10 include the external connection terminals 10 disposed on the second major surface 92 of the mounting board 9 and the external connection terminals 10 coupled to the through electrodes 510.

In the radio-frequency module 100b according to the third embodiment, the second resin layer 17 covers the major surface 51 opposite to the mounting board 9, of the fifth electronic component 5.

In the radio-frequency module 100b according to the third embodiment, as with the radio-frequency module 100 according to the first embodiment, the thickness T1 of the first region 901 of the mounting board 9 is less than the thickness T2 of the second region 902 of the mounting board 9, and thus, the radio-frequency module 100a according to the second embodiment can achieve a low-profile structure.

Modifications

The first to third embodiments described above are mere examples of various embodiments of the present disclosure. Various modifications to the first to third embodiments may be made for, for example, different designs when possible benefits of the present disclosure can be achieved; different constituent elements of different embodiments may be combined together as appropriate.

For example, a modification of the radio-frequency module 100 may have a circuit configuration in which a matching network provided on the input terminal 611 side with respect to the filter 61 may include, as a circuit element, the inductor L1 that is adjacent to the filter 61 among the inductors L1 to L4 on the first major surface 91 of the mounting board 9. In the modification having such a circuit configuration, the inductor L1 and the filter 61 are disposed on the mounting board 9 such that the direction of the magnetic field generated around the inductor L1 is perpendicular to the longitudinal direction of the plurality of IDT electrodes of the filter 61, and as a result, it is possible to reduce coupling via an electromagnetic field between the signal path on the input terminal 611 side with respect to the filter 61 and the inductor L1. In this modification, it is thus possible to reduce the leakage of the signals outside the pass band of the filter 61 from the input terminal 611 side to the output terminal 612 side with respect to the filter 61, and consequently, the attenuation characteristic of the filter 61 can be improved. The longitudinal direction of an IDT electrode is the direction in which a plurality of electrode fingers included in the IDT electrode are aligned.

For example, the filters 61 to 65 are not limited to ladder filters, and may be, for example, longitudinally coupled resonator-type surface acoustic wave filters.

The acoustic wave filters forming the filters 61 to 65 use a surface acoustic wave; but this should not be construed in a limiting sense, and the acoustic wave filters forming the filters 61 to 65 may be acoustic wave filters using, for example, a bulk acoustic wave, boundary acoustic wave, or plate wave.

The radio-frequency modules 100, 100*a*, and 100*b* include the fifth electronic component 5 disposed on the second major surface 92 of the mounting board 9, but this should not be construed in a limiting sense. For example, the radio-frequency modules 100, 100*a*, and 100*b* may be configured such that the fifth electronic component 5 is disposed on the first major surface 91 of the mounting board 9, and no electronic component is disposed on the second major surface 92 of the mounting board 9.

In the radio-frequency modules 100, 100*a*, and 100*b*, the fifth electronic component 5 disposed on the second major surface 92 of the mounting board 9 overlaps a portion of the first region 901 and a portion of the second region 902 of the mounting board 9, when viewed in plan view in the thickness direction D1 of the mounting board 9, but this should not be construed in a limiting sense. For example, when viewed in plan view in the thickness direction D1 of the mounting board 9, the fifth electronic component 5 may entirely coincide with a portion or all of the first region 901 of the mounting board 9 without overlapping the second region 902. Alternatively, the fifth electronic component 5 may entirely coincide with a portion or all of the second region 902 of the mounting board 9 without overlapping the first region 901.

In the radio-frequency modules 100, 100*a*, and 100*b*, the plurality of electronic components only need to include at least the first electronic component 1 and the second electronic component 2.

The communication device 200 according to the first embodiment may include the radio-frequency module 100*a* or the radio-frequency module 100*b* instead of the radio-frequency module 100.

The radio-frequency modules 100, 100*a*, and 100*b* are not limited to receiver modules including receive filters (the filters 61 to 65) and the low-noise amplifiers 71 and 72. The radio-frequency modules 100, 100*a*, and 100*b* may be, for example, transmitter modules including transmit filters and power amplifiers, or transceiver modules including transmit filters, power amplifiers, receive filters, and low-noise amplifiers. The first electronic component 1, the second electronic component 2, the third electronic component 3, the fourth electronic component 4, and the fifth electronic component 5 are not limited to the electronic components described as an example. The first electronic component 1, the second electronic component 2, the third electronic component 3, and the fourth electronic component 4 are not limited to particular kinds of electronic components, when, for example, the height H1 of the first electronic component 1, the height H2 of the second electronic component 2, the height H3 of the third electronic component 3, and the height H4 of the fourth electronic component 4 satisfy the following condition: H1>H2, H3>H2, H4<H1, and H4<H3. The first electronic component 1 is not limited to a chip inductor, and may be, for example, an acoustic wave filter, chip capacitor, low-noise amplifier, IC chip, or power amplifier. The second electronic component 2 is not limited to an acoustic wave filter, and not limited to, for example, a chip inductor; the second electronic component 2 may be a chip capacitor, low-noise amplifier, IC chip, or power amplifier. Regarding chip inductor, as the height of the chip inductor increases, the Q factor of the chip inductor tends to increase.

Aspects

This specification discloses the following aspects.

A radio-frequency module (100; 100*a*; 100*b*) according to a first aspect includes a mounting board (9), a first electronic component (1), and a second electronic component (2). The mounting board (9) has a first major surface (91) and a second major surface (92) opposite to each other. The first electronic component (1) is disposed on the first major surface (91) of the mounting board (9). The second electronic component (2) is disposed on the first major surface (91) of the mounting board (9). The second electronic component (2) is lower in height than the first electronic component (1). The mounting board (9) includes a plurality of dielectric layers (94), a plurality of conductive layers (95), and a plurality of via-conductors (96). In the mounting board (9), the dielectric layers (94) and the conductive layers (95) are stacked in a thickness direction (D1) of the mounting board 9. The mounting board (9) has a first region (901) and a second region (902). The first region (901) overlaps the first electronic component (1) when viewed in plan view in the thickness direction (D1) of the mounting board (9) and extends from the first major surface (91) to the second major surface (92). The second region (902) overlaps the first electronic component (1) when viewed in plan view in the thickness direction (D1) of the mounting board (9) and extends from the first major surface (91) to the second major surface (92). In the mounting board (9), the conductive layers (95) in the first region (901) are fewer than the conductive layers (95) in the second region (902). In the mounting board (9), a thickness (T1) of the first region (901) is less than a thickness (T2) of the second region (902).

The radio-frequency module (100; 100*a*; 100*b*) according to the first aspect can achieve a low-profile structure.

The radio-frequency module (100; 100*a*; 100*b*) according to a second aspect, with respect to the first aspect, further includes a third electronic component (3) and a fourth electronic component (4). The third electronic component (3) is disposed on the first major surface (91) of the mounting board (9). The third electronic component (3) is higher in height than the second electronic component (2). The fourth electronic component (4) is disposed on the first major surface (91) of the mounting board (9). The fourth electronic component (4) is lower in height than both the first electronic component (1) and the third electronic component (3). When viewed in plan view in the thickness direction (D1) of the mounting board (9), the first electronic component (1) is adjacent to the third electronic component (3), and the second electronic component (2) is adjacent to the fourth electronic component (4). The first region (901) overlaps the first electronic component (1) and the third electronic component (3) when viewed in plan view in the thickness direction (D1) of the mounting board (9). The second region (902) overlaps the second electronic component (2) and the fourth electronic component (4) when viewed in plan view in the thickness direction (D1) of the mounting board (9).

When the radio-frequency module (100; 100*a*; 100*b*) according to the second aspect further includes the third electronic component (3) higher in height than the second electronic component (2), the first region (901) of the mounting board (9) can be easily made.

The radio-frequency module (100; 100*a*; 100*b*) according to a third aspect is configured with respect to the first or second aspect. In the mounting board (9), the via-conductors

(96) in the first region (901) are fewer than the via-conductors (96) in the second region (902), when viewed in plan view in the thickness direction (D1) of the mounting board (9).

The radio-frequency module (100; 100a; 100b) according to the third aspect can be easily configured such that the thickness (T1) of the first region (901) is less than the thickness (T2) of the second region (902).

In the radio-frequency module (100; 100a; 100b) according to a fourth aspect, with respect to any one of the first to third aspects, the dielectric layers (94) in the first region (901) are equal in number to the dielectric layers (94) in the second region (902).

The radio-frequency module (100; 100a; 100b) according to the fourth aspect can be configured such that the thickness (T1) of the first region (901) of the mounting board (9) is less than the thickness (T2) of the second region (902), without forming through-holes, which make the first region (901) thinner than the second region (902), in one or more of dielectric sheets (for example, ceramic green sheets or resin sheets) used to form the dielectric layers (94) in the manufacturing process of the mounting board (9).

In the radio-frequency module (100; 100a; 100b) according to a fifth aspect, with respect to the fourth aspect, at least one of the conductive layers (95) includes a ground electrode (951). When viewed in plan view in the thickness direction (D1) of the mounting board (9), the ground electrode (951) is shaped as a mesh.

The radio-frequency module (100; 100a; 100b) according to the fifth aspect can further reduce the thickness of the mounting board (9).

In the radio-frequency module (100; 100a; 100b) according to a sixth aspect, with respect to the fifth aspect, the second electronic component (2) has a plurality of ground terminals (25) coupled to the ground electrode (951).

The radio-frequency module (100; 100a; 100b) according to the sixth aspect can suppress variations in the characteristics of the second electronic component (2).

In the radio-frequency module (100; 100a; 100b) according to a seventh aspect, with respect to any one of the first to sixth aspects, the first electronic component (1) is a chip inductor.

In the radio-frequency module (100; 100a; 100b) according to the seventh aspect, the conductive layers (95) in the first region (901) are less likely to block the magnetic field formed around the chip inductor forming the first electronic component (1), and thus, it is possible to suppress the degradation of the characteristics of the chip inductor.

The radio-frequency module (100; 100a; 100b) according to an eighth aspect, with respect to any one of the first to seventh aspects, further includes a plurality of external connection terminals (10) and a fifth electronic component (5). The external connection terminals (10) are disposed on the second major surface (92) of the mounting board (9). The fifth electronic component (5) is disposed on the second major surface (92) of the mounting board (9).

A communication device (200) according to a ninth aspect includes the radio-frequency module (100; 100a; 100b) according to any one of the first to eighth aspects and a signal processing circuit (201). The signal processing circuit (201) is coupled to the radio-frequency module (100; 100a; 100b).

In the communication device (200) according to the ninth aspect, the radio-frequency module (100; 100a; 100b) can achieve a low-profile structure.

What is claimed is:

1. A radio-frequency module comprising:
a mounting board having a first major surface and a second major surface opposite to each other;
a first electronic component disposed on the first major surface of the mounting board; and
a second electronic component disposed on the first major surface of the mounting board, the second electronic component being lower in height than the first electronic component, wherein
the mounting board includes
a plurality of dielectric layers,
a plurality of conductive layers, and
a plurality of via-conductors,
in the mounting board, the plurality of dielectric layers and the plurality of conductive layers are stacked in a thickness direction of the mounting board,
the mounting board has
a first region overlapping the first electronic component when viewed in plan view in the thickness direction of the mounting board, the first region extending from the first major surface to the second major surface, and
a second region overlapping the second electronic component when viewed in plan view in the thickness direction of the mounting board, the second region extending from the first major surface to the second major surface, and
in the mounting board,
of the plurality of conductive layers, conductive layers in the first region are fewer than conductive layers in the second region, and
the first region is thinner than the second region.

2. The radio-frequency module according to claim 1, further comprising:
a third electronic component disposed on the first major surface of the mounting board, the third electronic component being higher in height than the second electronic component; and
a fourth electronic component disposed on the first major surface of the mounting board, the fourth electronic component being lower in height than both the first electronic component and the third electronic component, wherein
when viewed in plan view in the thickness direction of the mounting board,
the first electronic component is adjacent to the third electronic component, and
the second electronic component is adjacent to the fourth electronic component,
when viewed in plan view in the thickness direction of the mounting board, the first region overlaps the first electronic component and the third electronic component, and
when viewed in plan view in the thickness direction of the mounting board, the second region overlaps the second electronic component and the fourth electronic component.

3. The radio-frequency module according to claim 2, wherein
in the mounting board, of the plurality of via-conductors, via-conductors in the first region are fewer than via-conductors in the second region, when viewed in plan view in the thickness direction of the mounting board.

4. The radio-frequency module according to claim 2, wherein of the plurality of dielectric layers, dielectric layers in the first region are equal in number to dielectric layers in the second region.

5. The radio-frequency module according to claim 2, wherein the first electronic component is a chip inductor.

6. The radio-frequency module according to claim 2, further comprising:

a plurality of external connection terminals disposed on the second major surface of the mounting board; and a fifth electronic component disposed on the second major surface of the mounting board.

7. The radio-frequency module according to claim 1, wherein in the mounting board, of the plurality of via-conductors, via-conductors in the first region are fewer than via-conductors in the second region, when viewed in plan view in the thickness direction of the mounting board.

8. The radio-frequency module according to claim 7, wherein of the plurality of dielectric layers, dielectric layers in the first region are equal in number to dielectric layers in the second region.

9. The radio-frequency module according to claim 7, wherein the first electronic component is a chip inductor.

10. The radio-frequency module according to claim 7, further comprising:

a plurality of external connection terminals disposed on the second major surface of the mounting board; and a fifth electronic component disposed on the second major surface of the mounting board.

11. The radio-frequency module according to claim 1, wherein of the plurality of dielectric layers, dielectric layers in the first region are equal in number to dielectric layers in the second region.

12. The radio-frequency module according to claim 11, wherein the first electronic component is a chip inductor.

13. The radio-frequency module according to claim 11, further comprising:

a plurality of external connection terminals disposed on the second major surface of the mounting board; and a fifth electronic component disposed on the second major surface of the mounting board.

14. The radio-frequency module according to claim 11, wherein at least one of the plurality of conductive layers includes a ground electrode, and the ground electrode is shaped as a mesh.

15. The radio-frequency module according to claim 14, wherein the second electronic component has a plurality of ground terminals coupled to the ground electrode.

16. The radio-frequency module according to claim 15, wherein the first electronic component is a chip inductor.

17. The radio-frequency module according to claim 14, wherein the first electronic component is a chip inductor.

18. The radio-frequency module according to claim 1, wherein the first electronic component is a chip inductor.

19. The radio-frequency module according to claim 1, further comprising:

a plurality of external connection terminals disposed on the second major surface of the mounting board; and a fifth electronic component disposed on the second major surface of the mounting board.

20. A communication device comprising:

the radio-frequency module according to claim 1; and a signal processing circuit coupled to the radio-frequency module.

* * * * *